US012125671B2

(12) United States Patent
Steenbrink et al.

(10) Patent No.: US 12,125,671 B2
(45) Date of Patent: Oct. 22, 2024

(54) MULTI-SOURCE CHARGED PARTICLE ILLUMINATION APPARATUS

(71) Applicant: ASML NETHERLANDS B.V., Veldhoven (NL)

(72) Inventors: Stijn Wilem Herman Karel Steenbrink, The Hague (NL); Marco Jan-Jaco Wieland, Delft (NL); Albertus Victor Gerardus Mangnus, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 341 days.

(21) Appl. No.: 17/778,036

(22) PCT Filed: Nov. 19, 2020

(86) PCT No.: PCT/EP2020/082702
§ 371 (c)(1),
(2) Date: May 19, 2022

(87) PCT Pub. No.: WO2021/104991
PCT Pub. Date: Jun. 3, 2021

(65) Prior Publication Data
US 2022/0415611 A1 Dec. 29, 2022

(30) Foreign Application Priority Data

Nov. 28, 2019 (EP) ..................................... 19212139
Aug. 3, 2020 (EP) ..................................... 20189242

(51) Int. Cl.
*H01J 37/317* (2006.01)
*H01J 37/141* (2006.01)
(Continued)

(52) U.S. Cl.
CPC ........ *H01J 37/3177* (2013.01); *H01J 37/141* (2013.01); *H01J 37/1474* (2013.01);
(Continued)

(58) Field of Classification Search
CPC ............... H01J 37/3177; H01J 37/3174; H01J 37/3175; H01J 37/141; H01J 37/12;
(Continued)

(56) References Cited

U.S. PATENT DOCUMENTS 4,996,441 A * 2/1991 Lischke ................. B82Y 40/00
250/398
2004/0232349 A1 11/2004 Kruit
(Continued)

FOREIGN PATENT DOCUMENTS

JP S60154442 8/1985
JP 61263217 A * 11/1986 .......... H01J 37/3007
JP S61263217 11/1986

OTHER PUBLICATIONS

International Search Report and Written Opinion issued in corresponding PCT Patent Application No. PCT/EP2020/082702, dated Feb. 17, 2021.

*Primary Examiner* — David E Smith
*Assistant Examiner* — Hsien C Tsai
(74) *Attorney, Agent, or Firm* — Pillsbury Winthrop Shaw Pittman, LLP

(57) ABSTRACT

A multi-source illumination apparatus for illuminating a sample with charged particles, wherein beams, from a plurality of sources, are arranged such that a beam from at least one source intersects, at a plane of a condenser lens, with at least part of one other beam from a different one of the plurality of sources. The condenser lens is configured to separately collimate the received beams from each source. A manipulator array arrangement is configured to manipulate (Continued)

the collimated beams to generate one or more beams, in a single column, that include charged particles from the plurality of sources. The manipulator array arrangement includes a multi-beam generator configured to receive the plurality of substantially parallel substantially collimated beams generated by the deflector array, and generate a multibeam in dependence on the received plurality of substantially parallel substantially collimated beams, wherein the multi-beam includes a plurality of substantially collimated sub-beams.

20 Claims, 17 Drawing Sheets

(51) Int. Cl.
*H01J 37/147* (2006.01)
*H01J 37/28* (2006.01)

(52) U.S. Cl.
CPC ....... *H01J 37/28* (2013.01); *H01J 2237/0453* (2013.01); *H01J 2237/2817* (2013.01)

(58) Field of Classification Search
CPC .... H01J 37/1474; H01J 37/28; H01J 37/3007; H01J 37/153; H01J 37/063; H01J 2237/1205; H01J 2237/26; H01J 2237/151; H01J 2237/31774
See application file for complete search history.

(56) References Cited

U.S. PATENT DOCUMENTS

| | | |
|---|---|---|
| 2013/0168569 A1 | 7/2013 | Yamaguchi et al. |
| 2017/0025243 A1 | 1/2017 | Ren et al. |
| 2019/0198293 A1 | 6/2019 | Ogasawara |

* cited by examiner

MULTI-SOURCE CHARGED PARTICLE ILLUMINATION APPARATUS

CROSS-REFERENCE TO RELATED APPLICATIONS

This application is the U.S. national phase entry of PCT Patent Application No. POT/EP2020/082702 which was filed on Nov. 19, 2020, which claims the benefit of priority of European Patent Application No. 19212139.0 which was filed on Nov. 28, 2019 and of European Patent Application No. 20189242.9 which was filed on Aug. 3, 2020 and which are each incorporated herein in its entirety by reference.

FIELD

The embodiments provided herein generally relate to a charged particle illumination apparatus, and more particularly, a charged particle beam illumination apparatus including more than one source of charged particles.

BACKGROUND

When manufacturing semiconductor integrated circuit (IC) chips, undesired pattern defects, as a consequence of, for example, optical effects and incidental particles, inevitably occur on a substrate (i.e. wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an import process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause electrons to be emitted from the surface, such as secondary electrons, backscattered electrons or Auger electrons. The generated secondary electrons may be emitted from the material structure of the sample. By scanning the primary electron beam as the probing spot over the sample surface, secondary electrons can be emitted across the surface of the sample. By collecting these emitted secondary electrons from the sample surface, a pattern inspection tool may obtain an image representing characteristics of the material structure of the surface of the sample.

Another application for a charged particle beam is lithography. The charged particle beam reacts with a resist layer on the surface of a substrate. A desired pattern in the resist can be created by controlling the locations on the resist layer that the charged particle beam is directed towards.

There is a general need to improve the generation of a charged particle beam for use in electron microscopy as well as for other applications, such as lithography.

SUMMARY

The embodiments provided herein disclose a charged particle beam illumination apparatus. The charged particle beam illumination apparatus may be used to generate a multi-beam of charged particles. The charged particle beam illumination apparatus may be comprised within an inspection apparatus or a lithography apparatus.

According to a first aspect of the invention, there is provided a multi-source illumination apparatus for illuminating a sample with charged particles, the apparatus comprising: a plurality of sources that are each arranged to emit a beam of charged particles; a condenser lens arranged to receive beams from the plurality of sources; and a manipulator array arrangement configured to receive beams that have passed through the condenser lens; wherein: the beams are arranged such that, at a plane of the condenser lens, a beam from at least one source intersects with at least part of one other beam from a different one of the plurality of sources; the condenser lens is configured to separately substantially collimate the received beams from each source; and the manipulator array arrangement is configured to manipulate the beams that have been substantially collimated by the condenser lens to thereby generate one or more beams, in a single column, that comprise charged particles from the plurality of sources.

According to a second aspect of the invention, there is provided a multi-beam inspection tool comprising: the multi-source illumination apparatus according to the first aspect, wherein the multi-source illumination apparatus is arranged to illuminate a sample; and a detector arranged to detect charged particles received from the illuminated sample.

According to a third aspect of the invention, there is provided a multi-beam lithography tool comprising the multi-source illumination apparatus according to the first aspect, wherein the multi-source illumination apparatus is arranged to illuminate a resist on a substrate.

According to a fourth aspect of the invention, there is provided a multi-source illumination apparatus for generating a multi-beam of charged particles, the apparatus comprising: a plurality of sources that are each arranged to emit a beam of charged particles; and a manipulator array arrangement that comprises a beam input and a beam output; wherein: the beam input is configured to receive beams from the plurality of sources; the beams are arranged such that, at the beam input and in a plane that is substantially orthogonal to the charged particle optical axis, the illumination area of each beam substantially abuts the illumination area one or more other beams; and the manipulator array arrangement is configured so that a multi-beam of charged particles is output from the beam output in a single column.

According to a fifth aspect of the invention, there is provided a method of generating one or more beams of charged particles for illuminating a sample, the method comprising: emitting, by each of a plurality of sources, a beam of charged particles such that the beams at least partially intersect; substantially collimating the beams from each source at position along the charged particle optical axis where the beams at least partially intersect; manipulating the substantially collimated beams to thereby generate one or more beams, in a single column, that comprise charged particles from the plurality of sources.

According to a sixth aspect of the invention, there is provided a multi-source illumination apparatus for illuminating a sample with charged particles, the apparatus comprising: a plurality of sources; a condenser lens arrangement configured to receive a beam of charged particles from each source and to separately substantially collimate the beams from each source; at least one source beam manipulator arrangement, wherein each source beam manipulator arrangement is arranged between a source and the condenser lens arrangement and configured to operate on the beam therebetween; and a manipulator array arrangement configured to receive beams that have passed through the condenser lens arrangement and to generate a single multi-beam of charged particles from the plurality of sources.

Other advantages of the present invention will become apparent from the following description taken in conjunction with the accompanying drawings wherein are set forth, by way of illustration and example, certain embodiments of the present invention.

BRIEF DESCRIPTION OF FIGURES

The above and other aspects of the present disclosure will become more apparent from the description of exemplary embodiments, taken in conjunction with the accompanying drawings.

DETAILED DESCRIPTION

Figure 1:
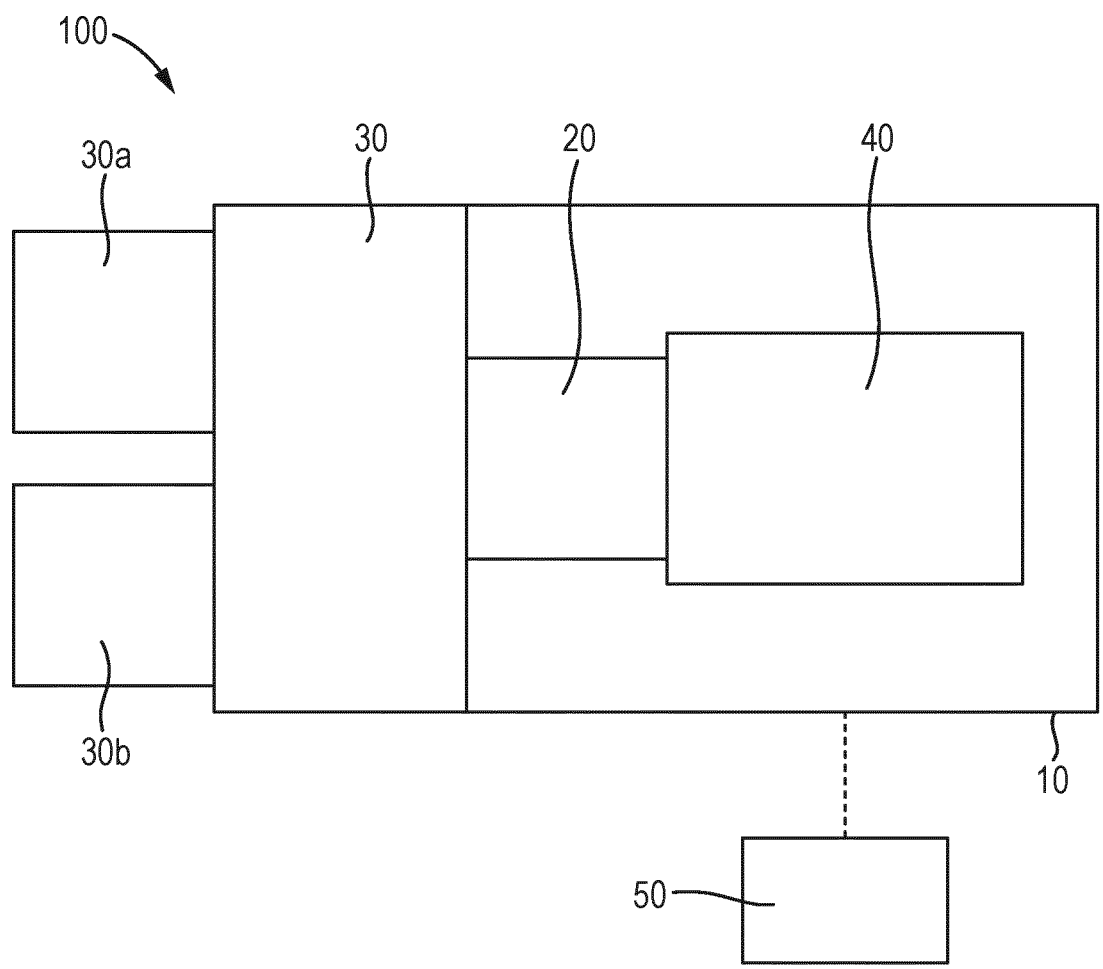
FIG. 1 is a schematic diagram illustrating an exemplary charged particle beam inspection apparatus.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Just one "killer defect" can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If an individual step has a yield of 95%, the overall process yield would be as low as 7%.

While high process yield is desirable in an IC chip manufacturing facility, maintaining a high substrate (i.e. wafer) throughput, defined as the number of substrates processed per hour, is also essential. High process yield and high substrate throughput can be impacted by the presence of a defect. This is especially if operator intervention is required for reviewing the defects. Thus, high throughput detection and identification of micro and nano-scale defects by inspection tools (such as a Scanning Electron Microscope ('SEM')) is essential for maintaining high yield and low cost.

A SEM comprises an scanning device and a detector apparatus. The scanning device comprises an illumination apparatus that comprises an electron source, for generating primary electrons, and a projection apparatus for scanning a sample, such as a substrate, with one or more focused beams of primary electrons. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e. a multi-beam, of primary electrons. The component beams of the multi-beam may be referred to as sub-beams or beamlets. A multi-beam can scan different parts of a sample simultaneously. A multi-beam inspection apparatus can therefore inspect a sample at a much higher speed than a single-beam inspection apparatus.

In a multi-beam inspection apparatus, the paths of some of the primary electron beams are displaced away from the central axis, i.e. a mid-point of the primary electron optical axis, of the scanning device. To ensure all the electron beams arrive at the sample surface with substantially the same angle of incidence, sub-beam paths with a greater radial distance from the central axis need to be manipulated to move through a greater angle than the sub-beam paths with paths closer to the central axis. This stronger manipulation may cause aberrations which result in blurry and out-offocus images of the sample substrate. In particular, for sub-beam paths that are not on the central axis, the aberrations in the sub-beams may increase with the radial displacement from the central axis. Such aberrations may remain associated with the secondary electrons when they are detected. Such aberrations therefore degrade the quality of images that are created during inspection.

An implementation of a known multi-beam inspection apparatus is described below.

The figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons throughout the present document may therefore be more generally be considered to be references to charged particles, with the charged particles not necessarily being electrons.

Reference is now made to FIG. 1, which is a schematic diagram illustrating an exemplary charged particle beam inspection apparatus 100. The charged particle beam inspection apparatus 100 of FIG. 1 includes a main chamber 10, a load lock chamber 20, an electron beam tool 40, an equipment front end module (EFEM) 30 and a controller 50. Electron beam tool 40 is located within main chamber 10.

EFEM 30 includes a first loading port 30a and a second loading port 30b. EFEM 30 may include additional loading port(s). First loading port 30a and second loading port 30b may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in EFEM 30 transport the samples to load lock chamber 20.

Load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from load lock chamber 20 to main chamber 10. Main chamber 10 is connected to a main chamber vacuum pump system (not shown). The main chamber vacuum pump system removes gas particles in main chamber 10 so that the pressure in around the sample reaches a second pressure lower than the first pressure. After reaching the second pressure, the sample is transported to the electron beam tool by which it may be inspected. An electron beam tool 40 may comprise a multi-beam electron-optical apparatus.

Controller 50 is electronically connected to electron beam tool 40. Controller 50 may be a processor (such as a computer) configured to control the charged particle beam inspection apparatus 100. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure.

The controller 50 may be located in one of the component elements of the charged particle beam inspection apparatus or it can be distributed over at least two of the component elements. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, that operate under the second pressure.

Figure 2:
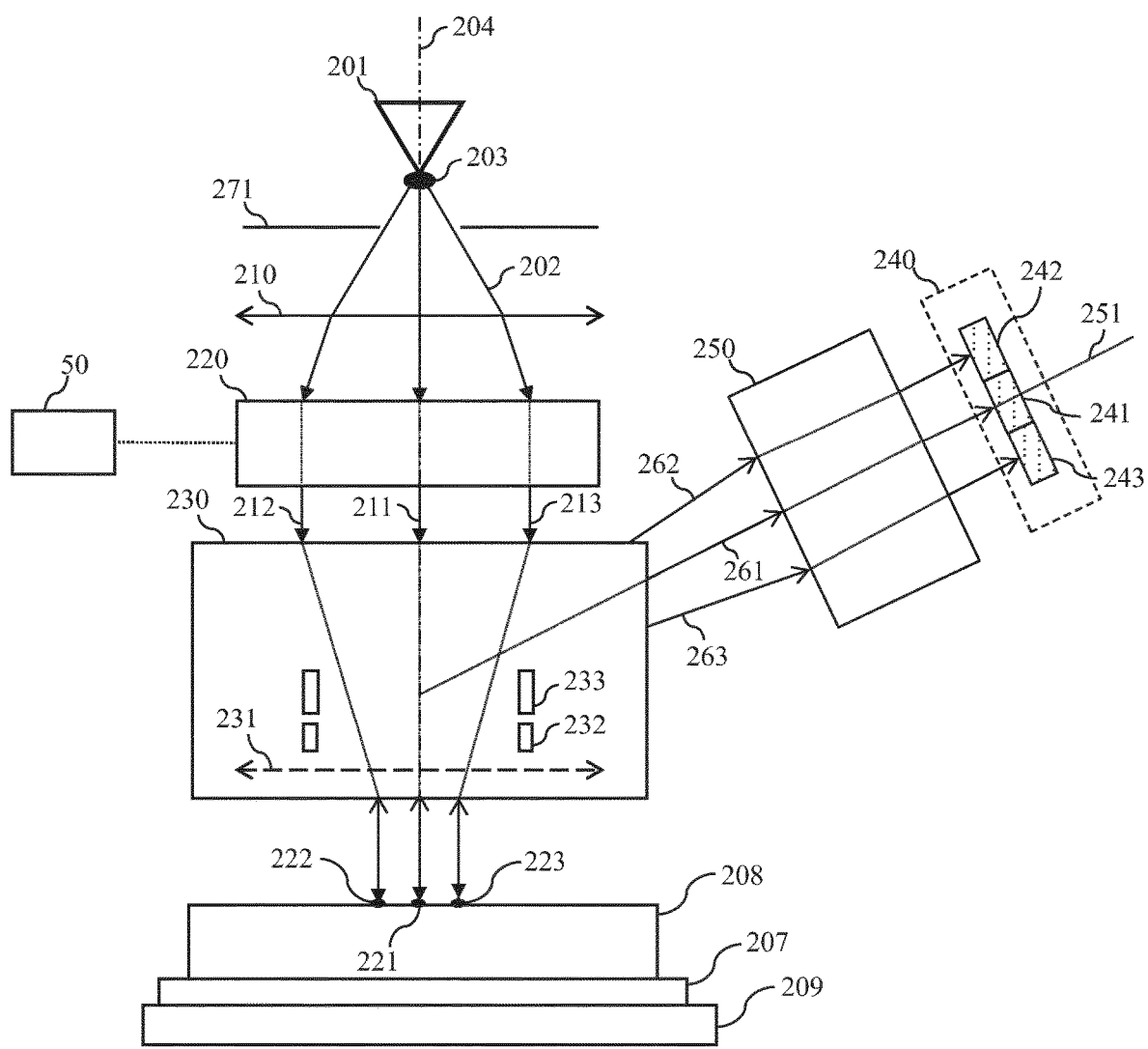
FIG. 2 is a schematic diagram illustrating an exemplary multi-beam apparatus that is part of the exemplary charged particle beam inspection apparatus of FIG. 1.

Reference is now made to FIG. 2, which is a schematic diagram illustrating an exemplary electron beam tool 40 including a multi-beam inspection tool that is part of the exemplary charged particle beam inspection apparatus 100 of FIG. 1. Multi-beam electron beam tool 40 (also referred to herein as apparatus 40) comprises an electron source 201, a gun aperture plate 271, a condenser lens 210, a source conversion unit 220, a primary projection apparatus 230, a motorized stage 209, and a sample holder 207. The electron source 201, a gun aperture plate 271, a condenser lens 210, a source conversion unit 220 are the components of an illumination apparatus comprised by the multi-beam electron beam tool 40. The sample holder 207 is supported by motorized stage 209 so as to hold a sample 208 (e.g., a substrate or a mask) for inspection. Multi-beam electron beam tool 40 may further comprise a secondary projection apparatus 250 and an associated electron detection device 240. Primary projection apparatus 230 may comprise an objective lens 231. Electron detection device 240 may comprise a plurality of detection elements 241, 242, and 243. A beam separator 233 and a deflection scanning unit 232 may be positioned inside primary projection apparatus 230.

The components that are used to generate a primary beam may be aligned with a primary electron-optical axis of the apparatus 40. These components can include: the electron source 201, gun aperture plate 271, condenser lens 210, source conversion unit 220, beam separator 233, deflection scanning unit 232, and primary projection apparatus 230. Secondary projection apparatus 250 and its associated electron detection device 240 may be aligned with a secondary electron-optical axis 251 of apparatus 40.

The primary electron-optical axis 204 is comprised by the electron-optical axis of the of the part of electron beam tool 40 that is the illumination apparatus. The secondary electron-optical axis 251 is the electron-optical axis of the of the part of electron beam tool 40 that is a detection apparatus. The primary electron-optical axis 204 may also be referred to herein as the primary optical axis (to aid ease of reference) or charged particle optical axis. The secondary electron-optical axis 251 may also be referred to herein as the secondary optical axis or the secondary charged particle optical axis.

Electron source 201 may comprise a cathode (not shown) and an extractor or anode (not shown). During operation, electron source 201 is configured to emit electrons as primary electrons from the cathode. The primary electrons are extracted or accelerated by the extractor and/or the anode to form a primary electron beam 202 that forms a primary beam crossover (virtual or real) 203. Primary electron beam 202 may be visualized as being emitted from primary beam crossover 203.

In this arrangement a primary electron beam, by the time it reaches the sample, and preferably before it reaches the projection apparatus, is a multi-beam. Such a multi-beam can be generated from the primary electron beam in a number of different ways. For example, the multi-beam may be generated by a multi-beam array located before the cross-over, a multi-beam array located in the source conversion unit 220, or a multi-beam array located at any point in between these locations. A multi-beam array may comprise a plurality of electron beam manipulating elements arranged in an array across the beam path. Each manipulating element may influence the primary electron beam to generate a sub-beam. Thus the multi-beam array interacts with an incident primary beam path to generate a multi-beam path down-beam of the multi-beam array.

Gun aperture plate 271, in operation, is configured to block off peripheral electrons of primary electron beam 202 to reduce Coulomb effect. The Coulomb effect may enlarge the size of each of probe spots 221, 222, and 223 of primary sub-beams 211, 212, 213, and therefore deteriorate inspection resolution. A gun aperture plate 271 may also be referred to as a coulomb aperture array.

Condenser lens 210 is configured to focus (or substantially collimate) primary electron beam 202. In an embodiment, condenser lens 210 may be designed to focus (or substantially collimate) primary electron beam 202 to become a substantially parallel beam and be substantially normally incident onto source conversion unit 220. Condenser lens 210 may be a movable condenser lens that may be configured so that the position of its first principle plane is movable. In an embodiment, the movable condenser lens may be configured to physically move, e.g. along the optical axis 204. Alternatively, the movable condenser lens may be constituted of two or more electro-optical elements (lenses) in which the principle plane of the condenser lens moves with a variation of the strength of the individual electro-optical elements. The (movable) condenser lens may be configured to be magnetic, electrostatic or a combination of magnetic and electrostatic lenses. In a further embodiment, the condenser lens 210 may be an anti-rotation condenser lens. The anti-rotation condenser lens may be configured to keep the rotation angles unchanged when the focusing power (collimating power) of condenser lens 210 is changed and/or when the principle plane of the condenser lens moves.

Source conversion unit 220 may comprise an image-forming element array, an aberration compensator array, a beam-limit aperture array, and a pre-bending micro-deflector array. The pre-bending micro-deflector array may deflect a plurality of primary sub-beams 211, 212, 213 of primary electron beam 202 to normally enter the beam-limit aperture array, the image-forming element array, and an aberration compensator array. In this arrangement, the image-forming element array may function as a multi-beam array to generate the plurality of sub-beams in the multi-beam path, i.e. primary sub-beams 211, 212, 213. The image forming array may comprise a plurality electron beam manipulators such as micro-deflectors micro-lenses (or a combination of both) to influence the plurality of primary sub-beams 211, 212, 213 of primary electron beam 202 and to form a plurality of parallel images (virtual or real) of primary beam crossover 203, one for each of the primary sub-beams 211, 212, and 213. The aberration compensator array may comprise a field curvature compensator array (not shown) and an astigmatism compensator array (not shown). The field curvature compensator array may comprise a plurality of micro-lenses to compensate field curvature aberrations of the primary sub-beams 211, 212, and 213. The astigmatism compensator array may comprise a plurality of micro-stigmators to compensate astigmatism aberrations of the primary sub-beams 211, 212, and 213. The beam-limit aperture array may be configured to limit diameters of individual primary sub-beams 211, 212, and 213. FIG. 2 shows three primary sub-beams 211, 212, and 213 as an example, and it should be understood that source conversion unit 220 may be configured to form any number of primary sub-beams. Controller 50 may be connected to various parts of charged particle beam inspection apparatus 100 of FIG. 1, such as source conversion unit 220, electron detection device 240, primary projection apparatus 230, or motorized stage 209. As explained in further detail below, controller 50 may perform various image and signal processing functions. Controller 50 may also generate various control signals to govern operations of the charged particle beam inspection apparatus, including the charged particle multi-beam apparatus.

Condenser lens 210 may further be configured to adjust electric currents of primary sub-beams 211, 212, 213 down-beam of source conversion unit 220 by varying the focusing power of condenser lens 210. Alternatively, or additionally, the electric currents of the primary sub-beams 211, 212, 213 may be changed by altering the radial sizes of beam-limit apertures within the beam-limit aperture array corresponding to the individual primary sub-beams. The electric currents may be changed by both altering the radial sizes of beam-limit apertures and the focusing power of condenser lens 210. If the condenser lens is moveable and magnetic, off-axis sub-beams 212 and 213 may result that illuminate source conversion unit 220 with rotation angles. The rotation angles change with the focusing power or the position of the first principal plane of the movable condenser lens. A condenser lens 210 that is an anti-rotation condenser lens may be configured to keep the rotation angles unchanged while the focusing power of condenser lens 210 is changed. Such a condenser lens 210 that is also movable, may cause the rotation angles not change when the focusing power of the condenser lens 210 and the position of its first principal plane are varied.

Objective lens 231 may be configured to focus sub-beams 211, 212, and 213 onto a sample 208 for inspection and may form three probe spots 221, 222, and 223 on the surface of sample 208.

Beam separator 233 may be, for example, a Wien filter comprising an electrostatic deflector generating an electrostatic dipole field and a magnetic dipole field (not shown in FIG. 2). In operation, beam separator 233 may be configured to exert an electrostatic force by electrostatic dipole field on individual electrons of primary sub-beams 211, 212, and 213. The electrostatic force is equal in magnitude but opposite in direction to the magnetic force exerted by magnetic dipole field of beam separator 233 on the individual electrons. Primary sub-beams 211, 212, and 213 may therefore pass at least substantially straight through beam separator 233 with at least substantially zero deflection angles.

Deflection scanning unit 232, in operation, is configured to deflect primary sub-beams 211, 212, and 213 to scan probe spots 221, 222, and 223 across individual scanning areas in a section of the surface of sample 208. In response to incidence of primary sub-beams 211, 212, and 213 or probe spots 221, 222, and 223 on sample 208, electrons are generated from the sample 208 which include secondary electrons and backscattered electrons. The secondary electrons propagate in three secondary electron beams 261, 262, and 263. The secondary electron beams 261, 262, and 263 typically have secondary electrons (having electron energy ≤50 eV) and may also have at least some of the backscattered electrons (having electron energy between 50 eV and the landing energy of primary sub-beams 211, 212, and 213). The beam separator 233 is arranged to deflect the path of the secondary electron beams 261, 262, and 263 towards the secondary projection apparatus 250. The secondary projection apparatus 250 subsequently focuses the path of secondary electron beams 261, 262, and 263 onto a plurality of detection regions 241, 242, and 243 of electron detection device 240. The detection regions may be the separate detection elements 241, 242, and 243 that are arranged to detect corresponding secondary electron beams 261, 262, and 263. The detection regions generate corresponding signals which are sent to controller 50 or a signal processing system (not shown), e.g. to construct images of the corresponding scanned areas of sample 208.

The detection elements 241, 242, and 243 may detect the corresponding secondary electron beams 261, 262, and 263. On incidence of secondary electron beams with the detection elements 241, 242 and 243, the elements may generate corresponding intensity signal outputs (not shown). The outputs may be directed to an image processing system (e.g., controller 50). Each detection element 241, 242, and 243 may comprise one or more pixels. The intensity signal output of a detection element may be a sum of signals generated by all the pixels within the detection element.

The controller 50 may comprise image processing system that includes an image acquirer (not shown) and a storage device (not shown). For example, the controller may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to an electron detection device 240 of the apparatus 40 permitting signal communication, such as an electrical conductor, optical fiber cable, portable storage media, IR, Bluetooth, internet, wireless network, wireless radio, among others, or a combination thereof. The image acquirer may receive a signal from electron detection device 240, may process the data comprised in the signal and may construct an image therefrom. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The image acquirer may acquire one or more images of a sample based on an imaging signal received from the electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time period. The multiple images may be stored in the storage. The controller 50 may be configured to perform image processing steps with the multiple images of the same location of sample 208.

The controller 50 may include measurement circuitry (e.g., analog-to-digital converters) to obtain a distribution of the detected secondary electrons. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of sample 208. The reconstructed images can thereby be used to reveal any defects that may exist in the sample.

The controller 50 may control motorized stage 209 to move sample 208 during inspection of sample 208. The controller 50 may enable motorized stage 209 to move sample 208 in a direction, preferably continuously, for example at a constant speed, at least during sample inspection. The controller 50 may control movement of the motorized stage 209 so that it changes the speed of the movement of the sample 208 dependent on various parameters. For example, the controller may control the stage speed (including its direction) depending on the characteristics of the inspection steps of scanning process.

Although FIG. 2 shows that apparatus 40 uses three primary electron sub-beams, it is appreciated that apparatus 40 may use two or more number of primary electron sub-beams. The present disclosure does not limit the number of primary electron beams used in apparatus 40.

Figure 3:
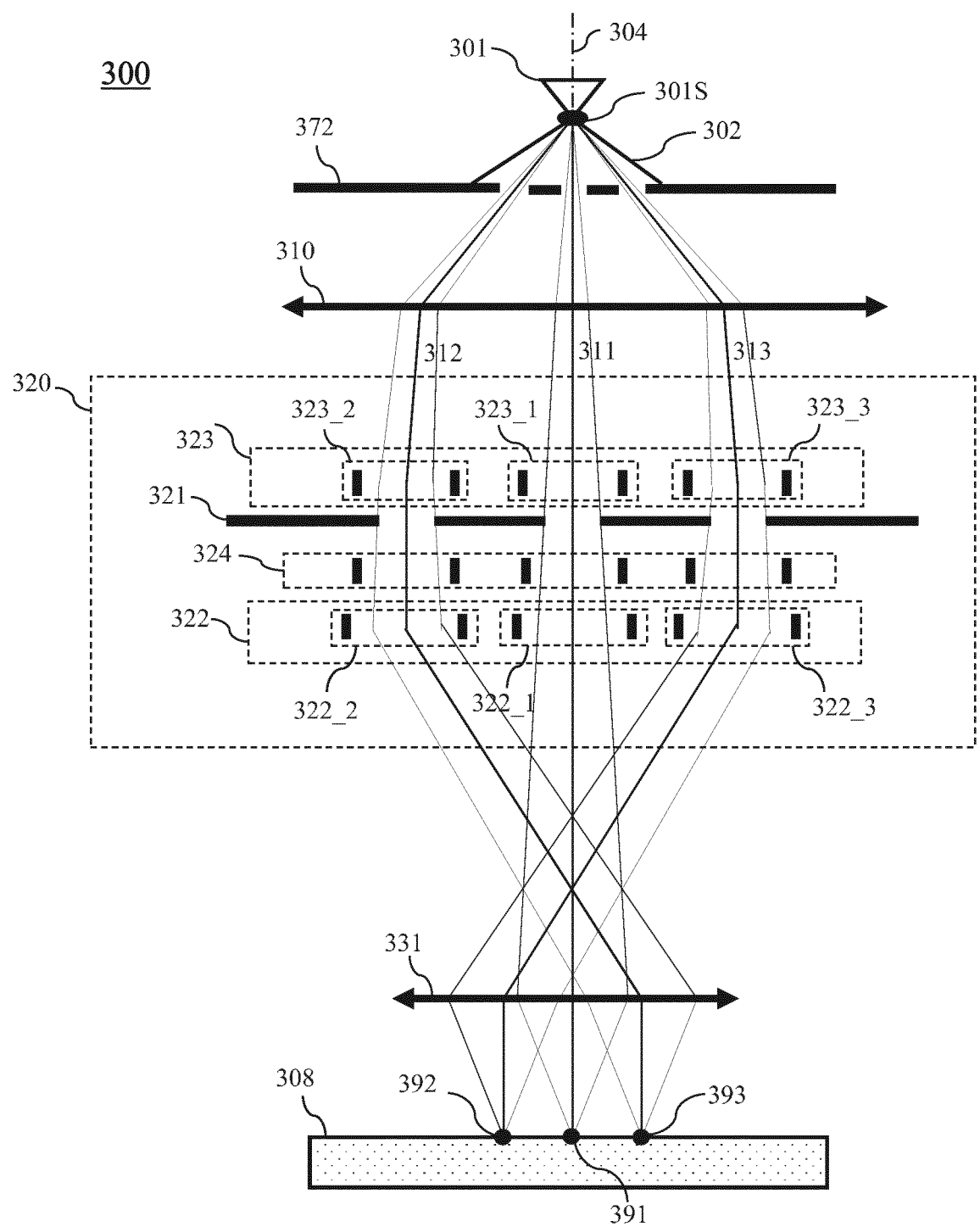
FIG. 3 is a schematic diagram of exemplary multi-beam apparatus illustrating an exemplary configuration of source conversion unit of the exemplary charged particle beam inspection apparatus of FIG. 1.

Reference is now made to FIG. 3, which is a schematic diagram of exemplary multi-beam apparatus illustrating an exemplary configuration of source conversion unit of the exemplary charged particle beam inspection apparatus of FIG. 1. The apparatus 300 may comprise an election source 301, a pre-sub-beam-forming aperture array 372, a condenser lens 310 (similar to condenser lens 210 of FIG. 2), a source conversion unit 320, an objective lens 331 (similar to objective lens 231 of FIG. 2), and a sample 308 (similar to sample 208 of FIG. 2). The election source 301, a pre-sub-beam-forming aperture array 372, a condenser lens 310 may be the components of an illumination apparatus comprised by the apparatus 300. The source conversion unit 320, an objective lens 331 may the components of a projection apparatus comprised by the apparatus 300. The source conversion unit 320 may be similar to source conversion unit 220 of FIG. 2 in which the image-forming element array of FIG. 2 is image-forming element array 322, the aberration compensator array of FIG. 2 is aberration compensator array 324, the beam-limit aperture array of FIG. 2 is beam-limit aperture array 321, and the pre-bending micro-deflector array of FIG. 2 is pre-bending micro-deflector array 323. The election source 301, the pre-sub-beam-forming aperture array 372, the condenser lens 310, the source conversion unit 320, and the objective lens 331 are aligned with a primary electron-optical axis 304 of the apparatus. The electron source 301 generates a primary-electron beam 302 generally along the primary electron-optical axis 304 and with a source crossover (virtual or real) 301S. The pre-sub-beam-forming aperture array 372 cuts the peripheral electrons of primary electron beam 302 to reduce a consequential Coulomb effect. The Coulomb effect is a source of aberration to the sub-beams due to interaction between electrons in different sub-beam paths. Primary-electron beam 302 may be trimmed into a specified number of sub-beams, such as three sub-beams 311, 312 and 313, by pre-sub-beam-forming aperture array 372 of a pre-sub-beam-forming mechanism. Although three sub-beams and their paths are referred to in the previous and following description, it should be understood that the description is intended to apply an apparatus, tool, or system with any number of sub-beams.

The source conversion unit 320 may include a beamlet-limit aperture array 321 with beam-limit apertures configured to limit the sub-beams 311, 312, and 313 of the primary electron beam 302. The source conversion unit 320 may also include an image-forming element array 322 with image-forming micro-deflectors, 322_1, 322_2, and 322_3. There is a respective micro-deflector associated with the path of each sub-beam. The micro-deflectors 322_1, 322_2, and 322_3 are configured to deflect the paths of the sub-beams 311, 312, and 313 towards the electron-optical axis 304. The deflected sub-beams 311, 312 and 313 form virtual images of source crossover 301S. The virtual images are projected onto the sample 308 by the objective lens 331 and form probe spots thereon, which are the three probe spots, 391, 392, and 393. Each probe spot corresponds to the location of incidence of a sub-beam path on the sample surface. The source conversion unit 320 may further comprise an aberration compensator array 324 configured to compensate aberrations of each of the sub-beams. The aberrations in each sub-beam are typically present on the probe spots, 391, 392, and 393 that would be formed a sample surface. The aberration compensator array 324 may include a field curvature compensator array (not shown) with micro-lenses. The field curvature compensator and micro-lenses are configured to compensate the sub-beams for field curvature aberrations evident in the probe spots, 391, 392, and 393. The aberration compensator array 324 may include an astigmatism compensator array (not shown) with micro-stigmators. The micro-stigmators are controlled to operate on the sub-beams to compensate astigmatism aberrations that are otherwise present in the probe spots, 391, 392, and 393.

The source conversion unit 320 may further comprise a pre-bending micro-deflector array 323 with pre-bending micro-deflectors 323_1, 323_2, and 323_3 to bend the sub-beams 311, 312, and 313 respectively. The pre-bending micro-deflectors 323_1, 323_2, and 323_3 may bend the path of the sub-beams onto the beamlet-limit aperture array 321. The sub-beam path of the incident on beamlet-limit aperture array 321 may be orthogonal to the plane of orientation of the beamlet-limit aperture array 321. The condenser lens 310 may direct the path of the sub-beams onto the beamlet-limit aperture array 321. The condenser lens 310 may focus the three sub-beams 311, 312, and 313 to become parallel beams along primary electron-optical axis 304, so that it is perpendicularly incident onto source conversion unit 320, which may correspond to the beamlet-limit aperture array 321.

The image-forming element array 322, the aberration compensator array 324, and the pre-bending micro-deflector array 323 may comprise multiple layers of sub-beam manipulating devices, some of which may be in the form or arrays, for example: micro-deflectors, micro-lenses, or micro-stigmators.

In source the conversion unit 320, the sub-beams 311, 312 and 313 of the primary electron beam 302 are respectively deflected by the micro-deflectors 322_1, 322_2 and 322_3 of image-forming element array 322 towards the primary electron-optical axis 304. It should be understood that the sub-beam 311 path may already correspond to the electron-optical axis 304 prior to reaching micro-deflector 322_1, accordingly the sub-beam 311 path may not be deflected by micro-deflector 322_1.

The objective lens 331 focuses the sub-beams onto the surface of the sample 308, i.e., it projects the three virtual images onto the sample surface. The three images formed by three sub-beams 311 to 313 on the sample surface form three probe spots 391, 392 and 393 thereon. The deflection angles of sub-beams 311 to 313 are adjusted by the objective lens 311 to reduce the off-axis aberrations of three probe spots 391~393. The three deflected sub-beams consequently pass through or approach the front focal point of objective lens 331.

At least some of the above-described components in FIG. 2 and FIG. 3 may individually, or in combination with each other, be referred to as a manipulator array, or manipulator, because they manipulate one or more beams, or sub-beams, of charged particles.

The above described multi-beam inspection tool comprises a multi-beam charged particle optical apparatus with a single source of charged particles. The charged particle optical apparatus comprises an illumination apparatus and a projection apparatus. The illumination apparatus may generate a multi-beam of charged particles from the beam of electrons from the source. The projection apparatus projects a multi-beam of charged particles towards a sample. At least part of the surface of a sample is scanned with the multi-beam of charged particles.

A problem with the above-described multi-beam illumination apparatus is that the current of each of the sub-beams is limited by the brightness of the source. The current of a sub-beam may be dependent on the ratio of the current provided by the source and the uniform illumination area at the surface of a beam limiting aperture array (that may be the upper surface of the source conversion unit 220). The used source of electrons is typically a high brightness source, such as a Schottky source or field emission source. Some known such sources are approaching the physical limit of the brightness that can be achieved. Improvements to the source designs will therefore not substantially increase their brightness. The physical limit on the brightness and total emission current of the electron source imposes an inherent limitation on the number of sub-beams that can be generated by a source.

Another limitation on the number of sub-beams that can be provided is that to increase the number of sub-beams, it is necessary to increase the total area/field that is illuminated by the source, i.e. the source's illumination area. However, increasing the illumination area of a source increases the amount of aberrations of the condenser lens. In particular, aberrations will be larger for the sub-beams that are at the largest radial distance from the electron-optical axis of the illumination apparatus.

There are therefore a number of problems that complicate increasing the number of beams provided by a multi-beam illumination apparatus with a single source.

A known approach to increasing the number of beams in a multi-beam illumination apparatus is to provide more than one source. Each source has its own column that is separate from the columns of the other sources. This approach is substantially equivalent to providing a plurality of single source illumination apparatuses in parallel with each other. A problem with this approach is that there are space restrictions on the required components for each column. In particular, due to space constraints, the condenser lens of each column is required to be relatively small. However, decreasing the size of the condenser lens increases the aberrations of the sub-beams.

Embodiments improve on the above techniques by providing a scanning device that comprises an illumination apparatus with more than one source and only one column. The illumination apparatus may generate a multi-beam of charged particles. The illumination apparatus may be used in an inspection apparatus, a lithography apparatus or for other applications.

Figure 4:
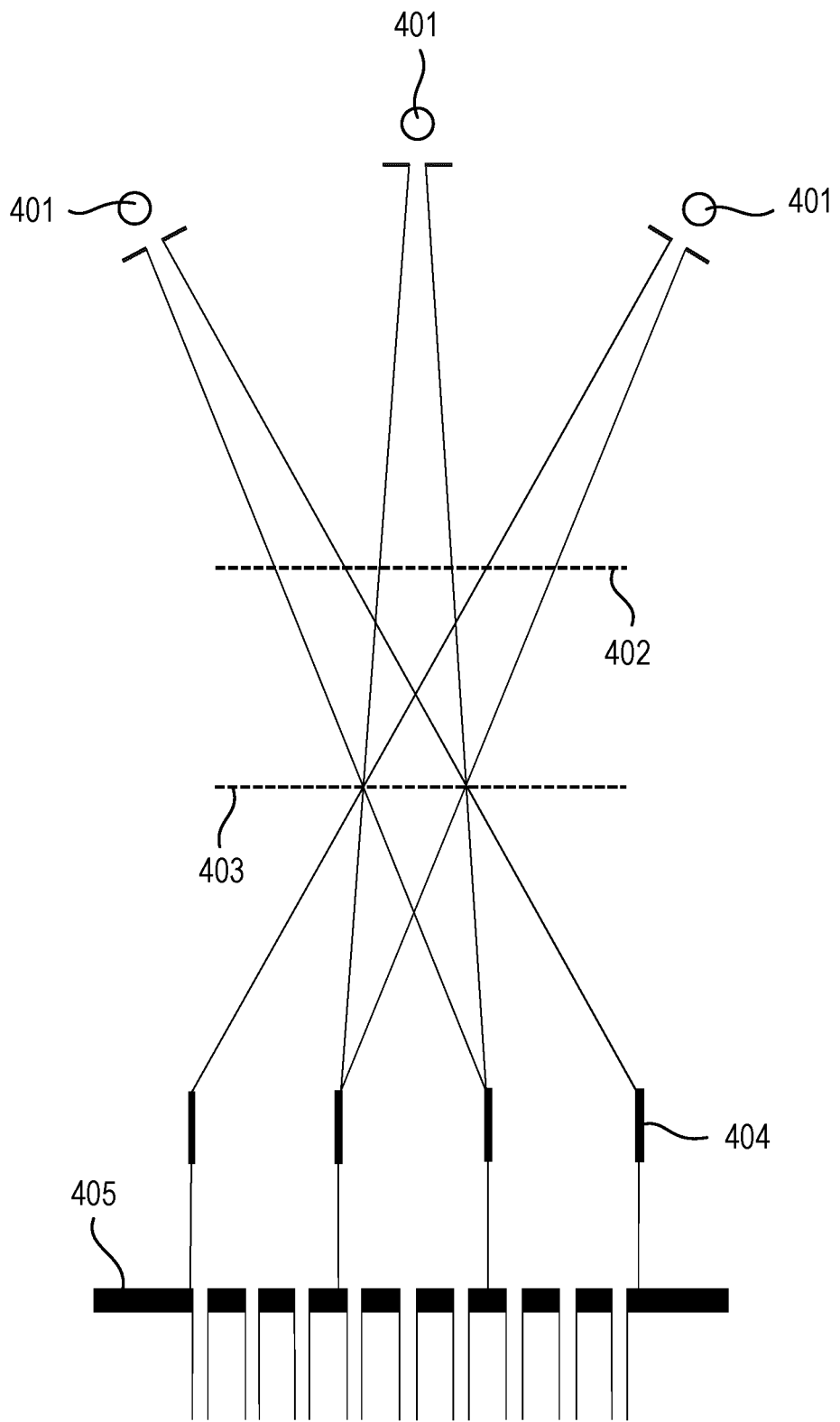
FIG. 4 is a multi-source illumination apparatus according to an embodiment.

FIG. 4 shows a multi-source illumination apparatus according to an embodiment. In this embodiment, multiple sources are used to generate a multi-beam of charged particles in a single column. Each sub-beam in the multi-beam may be a beam of primary electrons. The illumination apparatus may be part of a single column scanning device. The single column scanning device may also comprise a single projection apparatus.

The multi-source illumination apparatus comprises a plurality of sources 401 of charged particles. Each source 401 may be substantially the same as the known sources 201, 301 of charged particles described earlier with reference to FIG. 2 and FIG. 3. In FIG. 4 three sources 401 are shown. However, embodiments include there being any number of sources 401 so long as the number of sources 401 is two or more. For example, the number of sources 401 may be 2, 3, 4, 5, 8, 9, 10, 16, 17, 25, 26, 34 or 35. The sources may be arranged in a grid; so the number of sources may be 4, 9, 16, or any other square of a real number.

The multi-source illumination apparatus comprises a condenser lens 403. The condenser lens 403 has a plane through which charged particle beam paths from the sources passes. The plane of the condenser lens 403 may be orthogonal to the charged particle optical axis of the illumination apparatus.

The multi-source illumination apparatus comprises a manipulator system that is a manipulator array arrangement. The manipulator system may include at least two charged particle manipulating arrays 404, 405 which may be a deflector array 404 and a manipulator array 405. Embodiments also include there being more than one manipulator system and the deflector array 404 and the manipulator array 405 being provided separately from each other in different manipulator systems.

The deflector array 404 may comprise a plurality of separate deflectors, with each deflector having one or more deflector elements. The number of deflectors may be the same as the number of sources 401. There may be a one-to one correspondence between each deflector and each source 401. Thus, each deflector may be arranged to deflect charged particles from a different source 401.

The manipulator array 405 may comprise one or more components for generating a multi-beam in dependence on each received beam by the manipulator array 405. The multi-beam can thus be projected by a single column charged particle projection apparatus. The manipulator array 405 may comprise one or more components for manipulating one or more the sub-beams of each multi-beam. For example, the manipulator array 405 may comprise components for focusing sub-beams (such as a micro-lens array), deflecting sub-beams (such as a deflector array), changing the cross-sectional shape of sub-beams and blanking sub-beams. The manipulator array 405 may comprise substantially the same type of components as the source conversion unit 220 and/or primary projection apparatus 230 in FIG. 2 and/or the source conversion unit 320 in FIG. 3. In an arrangement the manipulator array 405 comprises substantially the same, if not the very same components as the source conversion units 220, 320 or the primary projection apparatus 230. The number of components is dependent on the number of sub-beams. The manipulator array 405 may support a substantially larger number of sub-beams than the source conversion unit 220 and/or primary projection apparatus 230 in FIG. 2 and/or the source conversion unit 320 in FIG. 3.

The operation of the multi-source illumination apparatus according to an embodiment will now be described. Each of the plurality of sources 401 generates and emits a beam of charged particles. The charged particles may be electrons. The beam generated by each source in the multi-source illumination apparatus may be referred to herein as a 'source beam'.

The central axis of each source beam of charged particles generated by a source 401 may be directed towards substantially the same position on the plane of the condenser lens 403. The plurality of source beams may therefore insect with each other in the same region on the plane of the condenser lens 403. That is to say, the central axes of the plurality of source beams cross each other at the plane of the condenser lens 403. The point of mutual intersection of two or more the source beams may be referred to as a cross-over. In a preferred implementation, all the source beams intersect at the same cross-over. Further, the cross-over may be at a central position of the condenser lens is, in a plane that is substantially orthogonal to the charged particle optical axis of the illumination apparatus. The condenser lens 403 converts each of the source beams that pass through it from being a divergent beam path to a substantially parallel, or substantially collimated, beam path. Although embodiments include the condenser lens 403 converting each source beam path to being an exactly collimated beam path, embodiments also include the condenser lens 403 converting each source beam path to being a substantially collimated beam path. That is to say, each source beam path may still be divergent down-beam of the condenser lens. For example, the angle between the source beam path and an exactly collimated beam path may be ±10 mRad.

The intersection of a central point the condenser lens 403 by the central axes of differently directed source beams allows an increase of illumination area of the manipulator system by the beams without the size of the condenser lens 403 being substantially increased. Passing the beams through the central point, or mid-point, of the condenser lens 403 by the central axes of differently directed source beams reduces the amount of aberrations in the beams that are generated. The increased illumination area allows more sub-beams to be provided.

The plurality of source beams, from the respective plurality of sources 401, that have passed through the condenser lens 403 each have substantially internally collimated beam paths (that is to say, each beam is substantially collimated within its own beam path). The source beam paths from the different sources are each divergent with respect to each other. The deflector array 404 converts these separate source beam paths into beams paths that are substantially parallel, or substantially collimated, with each other. The source beam paths down beam from the deflector array 404 may all be parallel with the charged particle optical axis of the illumination apparatus. The source beam from each source 401 may be deflected by a separate deflector in the deflector array 404. The beam path down-beam of the deflector array 404 is a plurality of separate source beams with each of the source beams being generated by a different source 401. The separation between the paths of the separate source beams, in a direction orthogonal to the charged particle optical axis, may be very small. This minimal separation between the source beams down beam of the deflector array 404 results in a substantially a single beam, herein after referred to as a 'column beam', to differentiate it from a beam derived from a single source. This column beam may have a larger beam width than any one of the source beams.

The deflector array 404 may comprise electrostatic deflectors and/or magnetic deflectors.

Down-beam of the deflector array 404, the column beam is input to the manipulator array 405. The manipulator array 405 may generate a plurality of sub-beams in a multi-beam in dependence on the received column beam from the deflector array 404. The manipulator array 405 may additionally manipulate and thus condition some, or all, of the sub-beams within the multi-beam by, for example, focusing sub-beams, deflecting sub-beams, changing the cross-sectional shape of sub-beams and blanking sub-beams.

The multi-beam path generated by the interaction of the column beam with the manipulator array 405 may be directed towards a sample so that the multi-beam illuminates a region on a sample according to known multi-beam projection techniques. The multi-beam path may be projected through a single column projection apparatus.

In another embodiment, the multi-source illumination apparatus further comprises an aperture array 402 which may be referred to as a Coulomb aperture array. The Coulomb aperture array 402, that may also referred to as a gun aperture array, is similar to gun aperture plate 271 of FIG. 2. The Coulomb aperture array 402 receives a source beam from at least one source 401. The Coulomb aperture array 402 may receive a source beam from all of the sources 401. The Coulomb aperture array 402 may generate a source multi-beam, i.e. a multi-beam generated from a single source beam, in dependence on each received source beam.

The operation of the condenser lens 403 may be substantially the same as in the embodiment without the Coulomb aperture array 402. A difference is that the condenser lens 403 receives source multi-beams from each source 401 instead of source beams. The sub-beams in each source multi-beam up-beam of the condenser lens 403 may be divergent. Down-beam of the condenser lens 403, the plurality of sub-beams in each source multi-beam may follow substantially parallel, or substantially collimated, paths. So from the condenser lens, each source beam follows an internally collimated beam path. Each sub-beam within the multi-beam is collimated within the multi-beam path.

Down-beam of the condenser lens 403 is the deflector array 404. The operation of the deflector array 404 on the source beam paths is the same as described in the previous embodiment except that each source beam is incident as a source multi-beam. Each source multi-beam that a deflector in the deflector array 404 receives is deflected such that its source sub-beams are all substantially parallel with the other source beam paths, or source multi-beam paths down-beam from the other deflectors in the deflector array 404.

Down-beam of the deflector array 404 is the manipulator array 405. The operation of manipulator array 405 may be substantially as described in the previous embodiment. The sub-beams incident on the manipulator array 405 may be arranged such that, for each sub-beam, the illumination area of the sub-beam on the manipulator array 405 is larger than a corresponding aperture on the manipulator array 405 to the sub-beam. The shape and current of each sub-beam down-beam from the manipulator array 405 is therefore dependent on the size and shape of the respective aperture for the sub-beam on the manipulator array 405.

In both of the above-described embodiments the components of the apparatus may be implemented in a number of ways. Some of the implementations according to embodiments are described below.

The manipulator array 405, and/or the deflector array 404, may comprise at least one micro-electro-mechanical system, MEMS. One or more MEMS may be provided for manipulating each sub-beam.

The manipulator array 405, and/or the deflector array 404, may output a multi-beam that is shaped. The shape of the manipulator array (and thus of the sub-beam array in the column beam) in a plan view may be rectangular, square, rhombic or hexagonal. The multi-beam generated as the sub-beams of the column multi-beam may be an N by N square array of sub-beams, where N is three, five, six, eleven or twelve. The number of sub-beams in the array may be between 100 and 5000.

The plane of the condenser lens 403 may be substantially orthogonal to the charged particle optical axis of the illumination apparatus. The plurality of substantially parallel beams output from the deflector array 404 may be substantially parallel with the charged particle optical axis of the apparatus.

All of the beams from all of the sources 401 may intersect with each other in the same region in plane of the condenser lens 403. Alternatively, two or more, but not all, of the beams from the sources 401 may intersect with each other in the same region in the plane of the condenser lens 403.

At the beam input to the manipulator array 405, current density of the beam from each source 401 should be substantially the same so that each sub-beam has substantially the same current. The achieve this, each of the sources 401 may be arranged to have substantially the same emission current and have substantially the same illumination area on the manipulator array 405. Variations in the emission current may be compensated for by variations in the illumination area so that uniform current density is maintained at the apertures of the manipulator array 405.

Alternatively, or additionally, each of one or more of the sources 401 may comprise a controller for controlling the extraction voltage of the source. The emission currents of the emitted beams of charged particles by one or more of the sources 401 may be measured and the extraction voltage controlled by a feedback loop. The emission currents of all the sources 401 may therefore be both independently controllable and also controlled to be the same, or otherwise balanced and/or appropriately controlled so that the current densities from each source 401 are appropriate at the beam input to the manipulator array 405. The sources 401 may also all be of the same, or similar, type and size.

Each of one or more of the sources 401 may emit a beam through an aperture structure with the aperture structure having an opening. The aperture structure may be part of the source 401. The beam width of the beam emitted from the source 401 is dependent on the size and shape of the opening of the aperture structure as well as the emission opening angle of the source. One or more actuators may be provided for controlling the size and/or shape of the opening and/or the orientation of the aperture structure. The emission opening angle is dependent on the tip shape of the source 401 and the extraction field. Embodiments include controlling the emission opening angle by controlling the voltage at the anode of each source 410 to thereby control the extraction field. The beam width and direction of the beam emitted by each of one or more, or all, of the sources 401 may therefore be independently controllable.

Each aperture structure may be arranged to impart a shape of a cross-section of the beam emitted by a source 401. The aperture comprises one or more openings. The substantial shape of the one or more openings may be shaped to be rectangular, square, round, in the form of linear slots and/or curved lines such as substantially crescent shaped, for example having the appearance of the shape of a banana.

At an input to the deflector array 404, and in a plane that is orthogonal to the charged particle optical axis of the apparatus, the beam from each source 401 may be arranged so that it is close to, but not overlapping with, the beam from another source 401. This may be achieved by appropriate positioning of the sources 401, the condenser lens 403 and deflector array 404 with respect to each other. In addition, this may be achieved by the above-described techniques for controlling of the beam width, and beam direction, of the beams emitted by sources 401.

The condenser lens 403 may be a single lens. Alternatively, the condenser lens 403 may be a condenser lens arrangement 403 that comprises a plurality of lenses arranged in series with each other. The plurality of lenses may be arranged along the charged particle optical axis of the apparatus. Beams from the sources 401 pass through the plurality of lenses of the condenser lens arrangement 403.

Two or more of the sources 401 may be arranged symmetrically about the charged particle optical axis of the apparatus.

All of the sources 401 may be arranged in a plane that is orthogonal to the charged particle optical axis of the apparatus. Alternatively, all of the sources 401 may be arranged equidistant from a mid-point of the region on the plane of the condenser lens 403 where the beams from the sources 401 intersect with each other.

The sources may be arranged so that, when viewed along the charged particle optical axis, the sources are arranged in a circular or square grid. There may be four, nine or sixteen sources, or indeed the number of sources may be a square of a real number.

When the multi-source illumination apparatus according to embodiments is used to generate a multi-beam, the separation between adjacent sub-beams within the multi-beam may be substantially constant. That is to say, the sub-beams of the multi-beam have a substantially constant pitch.

Figure 5:
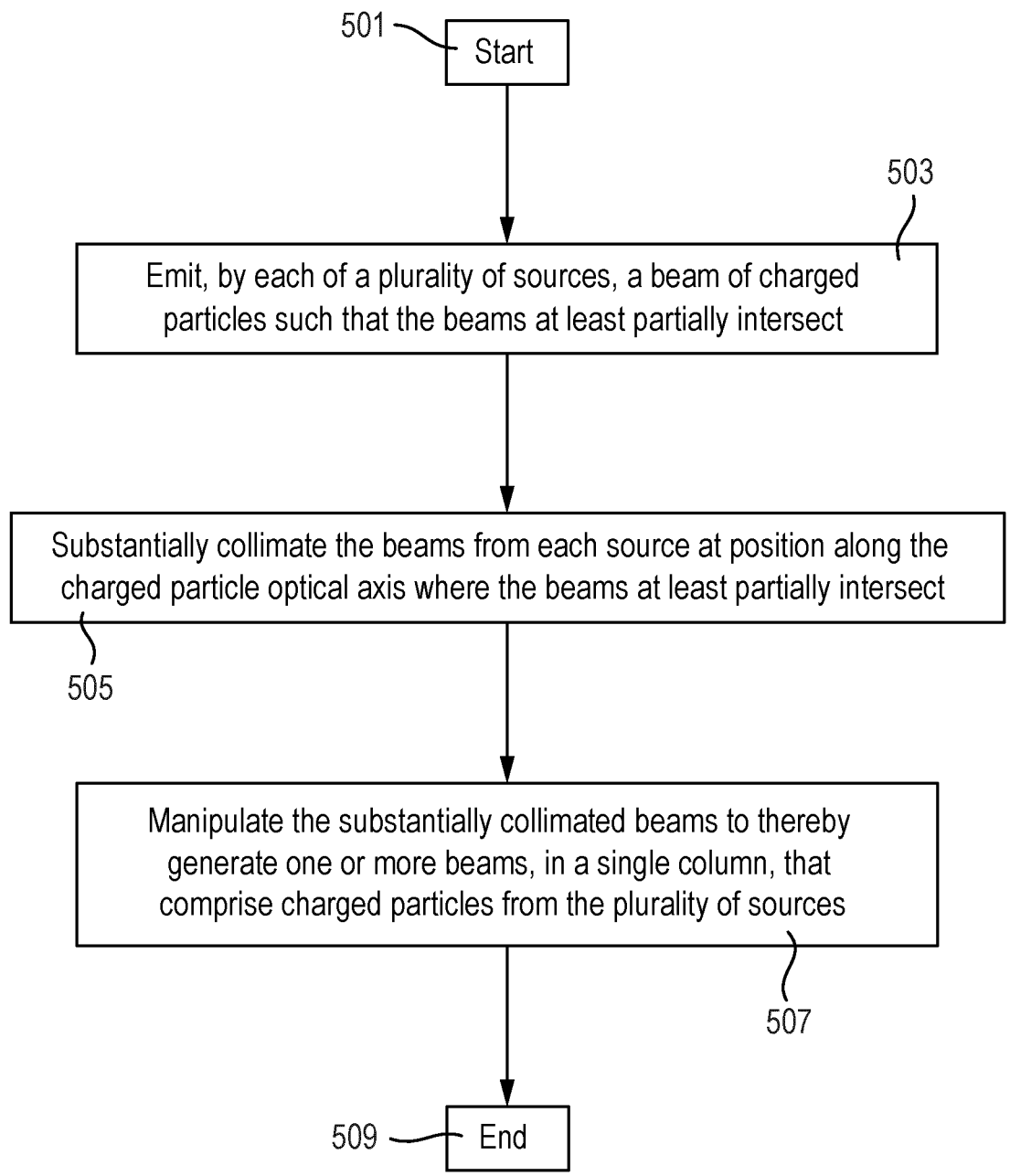
FIG. 5 is a flowchart of a process according to an embodiment.

FIG. 5 is a flowchart showing the steps of a process of generating one or more beams of charged particles for illuminating a sample according to an embodiment.

In step 501, the process starts.

In step 503, a beam of charged particles is emitted, by each of a plurality of sources, such that the beams at least partially intersect.

In step 505, the beams from each source are substantially collimated at position along the charged particle optical axis where the beams at least partially intersect.

In step 507, the substantially collimated beams are manipulated to thereby generate one or more beams, in a single column, that comprise charged particles from the plurality of sources.

In step 509, the process ends.

Optionally in-between steps 503 and 505, the source beams may be converted into source multi-beams by passing through coulomb aperture array 402. Thus, at step 505 the source multi-beams are collimated, so that the sub-beams within each source multi-beam are collimated within the source multi-beam paths.

Embodiments also include a number of improvements to the above-described techniques.

A condenser lens arrangement may cause aberrations in a beam. The aberrations caused by a condenser lens arrangement may be minimal for a beam that enters the condenser lens arrangement along an orthogonal axis to the plane of the condenser lens arrangement. The aberrations may increase as the angle of the beam increases relative to the orthogonal axis to the plane of the condenser lens arrangement.

In the embodiment shown in FIG. 4, the condenser lens arrangement 403 may cause aberrations in the beams from the sources that are not located on the charged particle optical axis. The aberrations caused by the condenser lens arrangement 403 may be reduced by reducing the entry angle of each beam into the condenser lens arrangement 403. The entry angle of a beam is the angle between the beam path of the beam and an orthogonal axis to the plane of the condenser lens arrangement 403. The entry angles of the beams may be reduced by positioning the sources 401 closer together. This may require increasing the distance between each source 401 and the condenser lens arrangement 403. However, positioning the sources closer together may be difficult due to space restraints within the apparatus. Increasing the distance between each source 401 and the condenser lens arrangement 403 may also be undesirable because it may increase Coulomb interaction effects. Increasing the distance between each source 401 and the condenser lens arrangement 403 may also increase the aberration that is reduced by decreasing the entry angle. Increasing distance between each source 401 and the condenser lens arrangement 403 may therefore counteract any gain achieved by reducing the entry angle.

Figure 6:
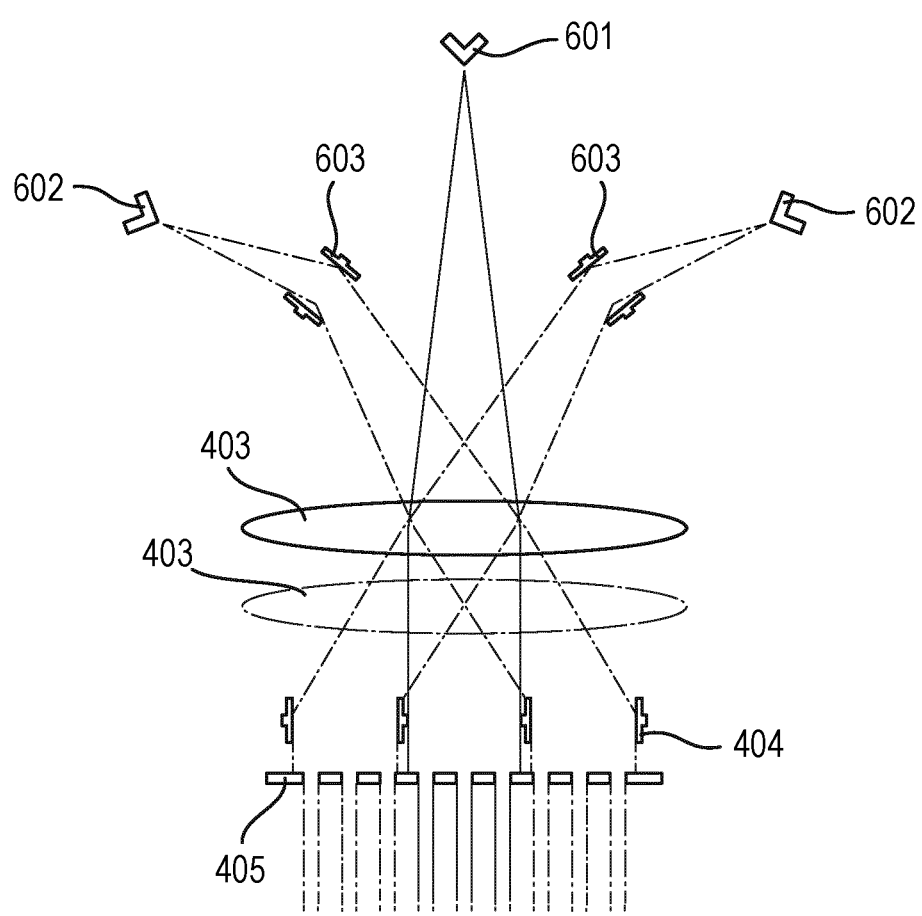
FIG. 6 is a multi-source illumination apparatus according to an embodiment.

An embodiment for reducing the aberrations caused by a condenser lens arrangement 403 is shown in FIG. 6. Note that the two elements for condenser lens 403 is intended to indicate the possible effective or actual range of position that the condenser lens 403 may have. This applies to other figures in which condenser lens is present.

The apparatus shown in FIG. 6, comprises: a source 601 that is on the charged particle optical axis; sources 602 that are not on the charged particle optical axis; source beam deflectors 603; a condenser lens arrangement 403; and a manipulator array 404, 405. Each source 601, 602 may be the same as a source 401 as described earlier with reference to FIG. 4. The condenser lens arrangement 403 may be the same as the condenser lens 403, or condenser lens arrangement 403, as described earlier with reference to FIG. 4. The manipulator array 404, 405 may be the same as the manipulator array 404, 405 as described earlier with reference to FIG. 4. Accordingly, the manipulator array 404, 405 may comprise manipulator array deflectors 404 and an manipulator aperture array 405 for generating sub-beams.

The apparatus shown in FIG. 6, differs from that shown in FIG. 4 by further comprising a source beam deflector 603 in each beam path between a source 602 that is not on the charged particle optical axis and the condenser lens arrangement 403. The deflection of a beam from a source 602 up-beam of the condenser lens arrangement 403 may reduce the entry angle of the beam into the condenser lens arrangement 403. Advantageously, the implementation shown in FIG. 6 may reduce the aberrations caused by the condenser lens arrangement 403. The sources 601, 602 may be positioned further apart from each other and so the available space within the apparatus for each source 601, 602 may increase.

When the deflection angle applied by each source beam deflector 603 is the same, a single ring of sources 602 may be provided around the charged particle optical axis of the apparatus. When there are differences in the deflection angles applied by the source beam deflectors 603, more than one ring of sources 602 may be provided around the charged particle optical axis. If sources are located at different distances from the charged particle optical axis, the sources may be arranged on a grid which may, for example, be rectilinear or hexagonal.

As described above, the manipulator array 404, 405 may comprise an manipulator aperture array 405 for generating a multi-beam in dependence on each received beam. Embodiments also include techniques for varying the current of the sub-beams output from the manipulator aperture array 405.

In a single source multi-beam system, it is known to use a condenser lens arrangement that comprises two condenser lenses. By using more than one condenser lens, the manipulator aperture array may be illuminated by a collimated beam when different beam currents are used. The beam current that illuminates a manipulator aperture array is dependent on the illumination area of a beam on the manipulator aperture array. The illumination area of a beam on the manipulator aperture array may be varied by adjustments made to the condenser lens arrangement.

In the multi-source apparatuses shown in FIGS. 4 and 6, a condenser lens arrangement that comprises a plurality of lenses may also be used for varying the beam currents that illuminate the manipulator aperture array 405. However, the beams from the different sources 601, 602 are preferably arranged/controlled so that they do not overlap on the manipulator aperture array 405. If a sub-beam aperture of the manipulator aperture array 405 is illuminated by source beams from more than one source 601, 602, then the sub-beam generated by the sub-beam aperture may have a substantially different current from some of the other sub-beams. The Coulomb aperture effects may also be increased.

Embodiments include techniques for maintaining a substantially constant illumination area of the manipulator aperture array 405 by each source beam when the beam currents of the sources 601, 602 are changed. The beam currents may therefore be changed, for example by operation of the condenser lens arrangement 403, without a sub-beam aperture of the manipulator aperture array being illuminated by source beams from more than one source 601, 602. The currents of the sub-beams output from the manipulator aperture array 405 may thereby be controlled.

Figure 7:
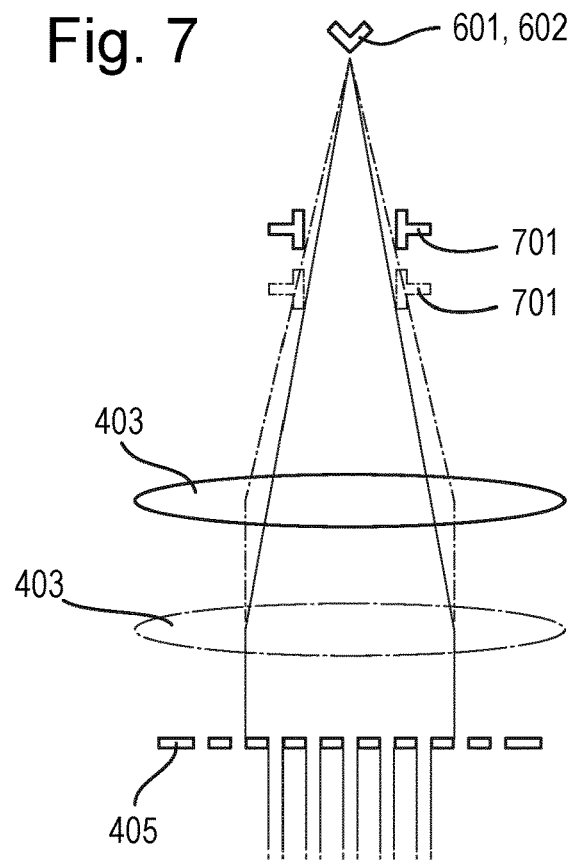
FIG. 7 is part of a multi-source illumination apparatus according to an embodiment.
Figure 8:
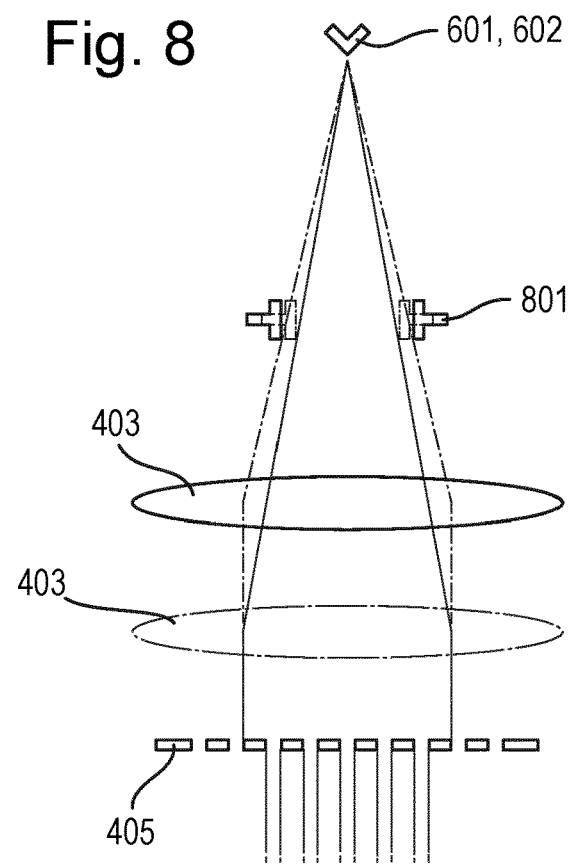
FIG. 8 is part of a multi-source illumination apparatus according to an embodiment.

FIGS. 7 and 8 show techniques for controlling a source beam width according to embodiments. For each source 601, 602, a corresponding width aperture 701, 801 may be provided. Each width aperture 701, 801 is arranged to restrict a source beam width and thereby restrict the maximum illumination area of the manipulator aperture array 405 by each source 601, 602. A width aperture may be, for example, an opening in a metal disc which may be circular.

In FIGS. 7 and 8, a width aperture 701, 801 is only shown for the source 601 that is on the charged particle optical axis. However, width apertures 701, 801 may be also used in a similar way with the sources 602 that are located off the charged particle optical axis, i.e. they are not on the charged particle optical axis of the apparatus. Note that width apertures 701, 801 are shown in solid and dotted outline to indicate that these features may have a range of settings. The dotted solid and dotted outline of the beam paths is intended to indicate the range of impact the width apertures may have on the beam path.

In the embodiment shown in FIG. 7, the width aperture 701 may have a constant diameter.

The extent that the width aperture 701 restricts the source beam width may varied by moving the width aperture 701 along the beam path of the source beam. That is, the position of the width aperture 701 on the path of the source beam may be variable and selectable.

In the embodiment shown in FIG. 8, the width aperture 801 may have a variable diameter. The extent to which the width aperture 801 restricts the source beam width is varied by adjusting a dimension of the width aperture 801. For example, the diameter of a single width aperture 801 may be adjusted in order to adjust the width of the beam. Alternatively, there may be a strip comprising plurality of width apertures 801 with each width aperture 801 having a different diameter. The strip may be moved to the change the width aperture 801 that is used. A width aperture 801 of appropriate dimension may thereby be selected.

Embodiments include the width aperture 701, 801 both being moveable along the beam path of a source beam, as shown in FIG. 7, and the width aperture 701, 801 having an adjustable dimension, as shown in FIG. 8.

Accordingly, embodiments include using a width aperture to control each source beam width as well as a condenser lens arrangement 403 to control the beam currents that illuminate the manipulator aperture array 405. Each source beam may therefore have a substantially constant illumination area on the manipulator aperture array for different beam currents.

Figure 9A:
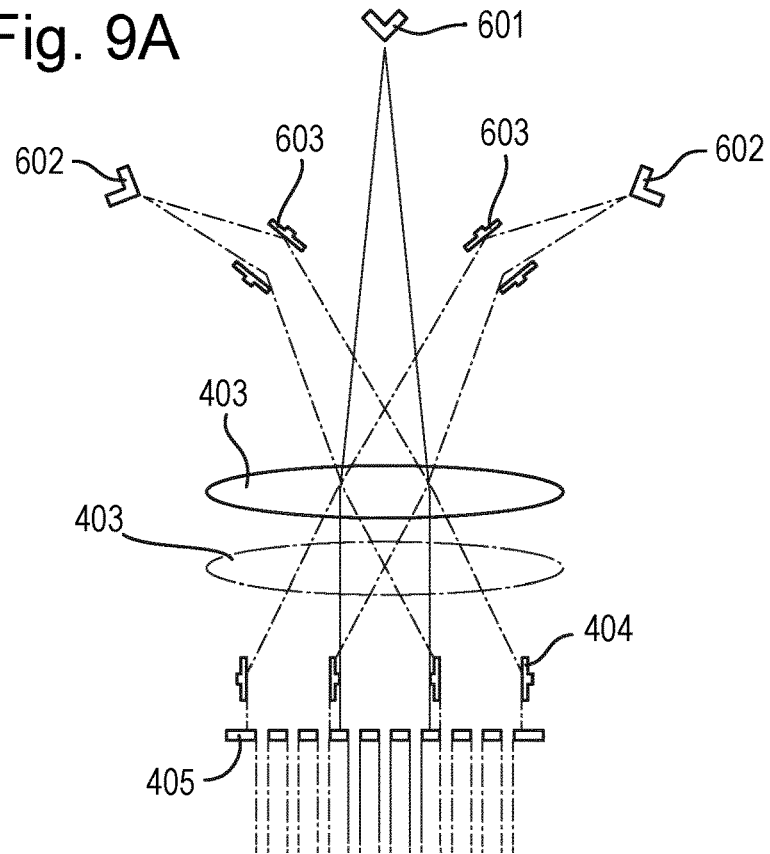
FIGS. 9A and 9B show different configurations of a multi-source illumination apparatus according to an embodiment.
Figure 9B:
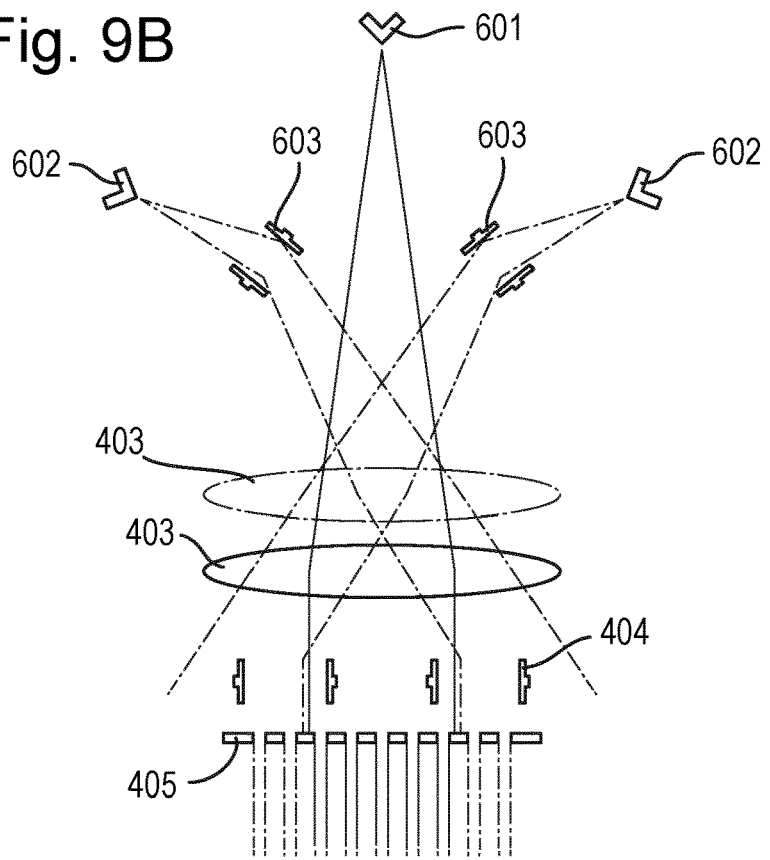

Another embodiment for controlling the source beam currents on the manipulator aperture array 405 is shown in FIGS. 9A and 9B.

In the embodiment shown in FIGS. 9A and 9B, source beam deflectors 603 are used, as described above with reference to FIG. 6, to reduce the entry angle of each source beam into the condenser lens arrangement 403. The condenser lens arrangement 403 may be used to vary the illumination area of each beam on the manipulator aperture array 405.

FIG. 9A shows the condenser lens arrangement 403 in a first configuration for providing the minimum illumination area by each source beam, and thereby the maximum sub-beam currents.

FIG. 9B shows the condenser lens arrangement 403 in a second configuration for providing a larger illumination area by each source beam, and thereby lower sub-beam currents. The condenser lens arrangement 403 is used to create a broader central beam, resulting in a smaller current per sub-beam aperture. This broader beam is used to cover more apertures in the manipulator aperture array 405. The beams from the other sources 602 are also broader. The source beam deflectors 603 are configured to apply deflections to incoming beams so that overlap between adjacent beams is avoided. Adjacent beams consequently do not overlap with each other.

A number of known techniques may be used to control the condenser lens arrangement 403 in order to adjust the illumination areas of the sources 601, 602. For example, the entire condenser lens arrangement 403 may be moved along the charged particle optical axis. Alternatively, or additionally, lenses within the condenser lens arrangement 403 may have a variable parameter. For example, the lenses be moved relative to each other. Alternatively, or additionally, the condenser lens arrangement may comprise one or more electro-magnetic lenses. The excitation state of each electro-magnetic lens may be varied, for example by varying the current through the electro-magnetic lens.

The opening angle of each source 601, 602 may be the same, or varied, for each configuration of the condenser lens arrangement 403.

As illustrated in FIG. 9B, when each source beam is broadened, the collimated source beams do not fit within the manipulator array deflectors 404. Although not shown in FIG. 9B, embodiments include moving the manipulator array deflectors 404 and increasing the width between each pair of manipulator array deflectors 404. The position of the manipulator array deflectors 404 can thereby be changed so that each pair of manipulator array deflectors 404 can appropriately deflect a single beam.

Alternatively, the manipulator array may not comprise manipulator array deflectors 404 for each source beam as shown in FIG. 9A. The manipulator array may alternatively comprise an individual deflector for each aperture in the manipulator aperture array 405. The deflector for each sub-beam may be positioned above, or below, each aperture in the manipulator aperture array 405.

Figure 10A:
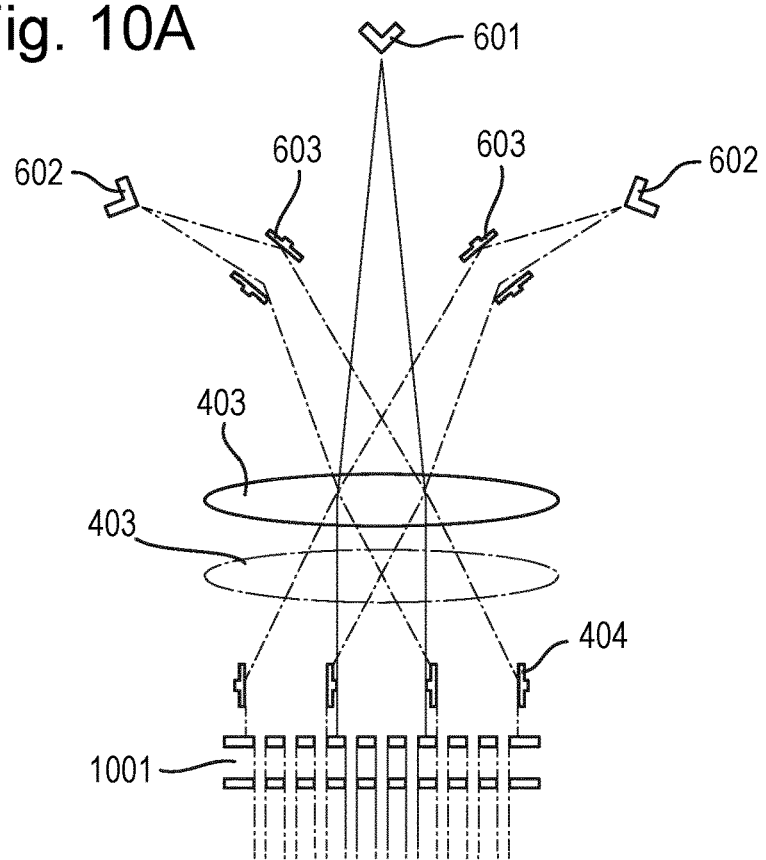
FIGS. 10A and 10B show different configurations of a multi-source illumination apparatus according to an embodiment.
Figure 10B:
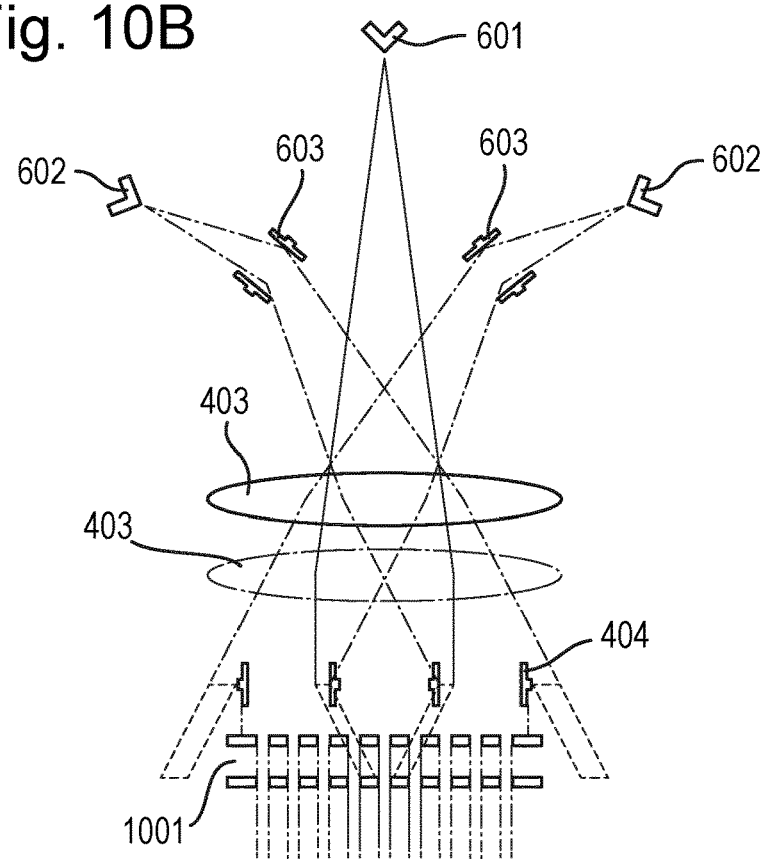

Another embodiment for controlling the sub-beam currents is shown in FIGS. 10A and 10B. In the present embodiment, the manipulator array comprises an manipulator aperture array arrangement 1001. The manipulator aperture array arrangement 1001 comprises two manipulator aperture arrays for defining sub-beams. A first manipulator aperture array of the manipulator aperture array arrangement 1001, is arranged so that it is illuminated by source beams and generates sub-beams. The two manipulator arrays may be referred to a first, or up-beam, manipulator aperture array and a second, or down-beam, manipulator aperture array 1002. The first manipulator array may be the same as the manipulator aperture array 405 in the above-described embodiments. A second manipulator aperture array of the manipulator aperture array arrangement 1001 is positioned down-beam from the first manipulator aperture array and is arranged to receive sub-beams generated by the first manipulator aperture array. The first and second manipulator aperture arrays may both be planar structures and in parallel planes. The first and second manipulator aperture arrays may be substantially the same as each other with corresponding apertures in each array aligned with each other in directions parallel to the charged particle optical axis.

In the present embodiment, the source beam widths may be changed by operation of the condenser lens arrangement 403, as described earlier with reference to FIGS. 9A and 9B. The source beam deflectors 603 may also be controlled to prevent overlap of illumination areas from adjacent source beams on the surface of the first manipulator aperture array of the manipulator aperture array arrangement 1001.

In the present embodiment, there may be a pair of manipulator array deflectors 404 for the beam from each source 601, 602. When the condenser lens arrangement 403 is in a first configuration, as shown in FIG. 10A, the manipulator array deflectors 404 deflect the source beams so that they are orthogonal to the plane of the manipulator aperture array arrangement 1001. Functionally, but for the design of the manipulator aperture array arrangement 1001, the apparatus in the configuration shown in FIG. 10A is the same as the apparatus with the configuration shown in FIG. 9A. The manipulator array arrangement 1001 is configured to be functionally the same as the manipulator aperture array 405. The beams from the different sources may cover substantially the full surface of the manipulator array deflectors 404. The beams from different sources do not overlap.

When condenser lens arrangement is in a second configuration, as shown in FIG. 10B, the direction of each beam output from a manipulator array deflector 404 may depend on the source 601, 602 that emitted the beam. Each manipulator array deflector 404 may be associated with the source beam of one of the sources 601, 602. Each manipulator array deflector 404 may deflect the path of the associated source beam so that it is orthogonal to the plane of the manipulator aperture array arrangement 1001. The manipulator array deflectors 404 may be positioned relative to the up-beam array of the manipulator aperture array arrangement 1001 such that the beams from the sources cover the up-beam array. The manipulator array deflectors may each be associated with a region of the up-beam array and arranged to appropriately deflect each beam when the apparatus is configured as shown in FIG. 10A. As described earlier with reference to the embodiment shown in FIGS. 9A and 9B, each source beam may be broadened. Consequently, each source beam may be broader than its associated deflector 404 and parts of the beam are either not deflected, or are deflected by a deflector other than the associated deflector 404. Such undeflected and mis-deflected parts of beams may not have a path orthogonal to the up-beam array 1001. Consequently, the first manipulator aperture array may generate both sub-beams that are parallel to the charged particle optical axis and also sub-beams that are not parallel to the charged particle optical axis. Due to the alignment of apertures in the up-beam and down-beam manipulator aperture arrays 1001, the sub-beams that are parallel to the charged particle optical axis pass through the down-beam manipulator aperture array. That is to say, these sub-beams are not blocked by the second manipulator aperture array. However, sub-beams that are angled off the parallel to the charged particle optical axis are blocked by the second manipulator aperture array. Accordingly, all of the sub-beams output from the second manipulator aperture array may have the same current and resolution. The use of an manipulator aperture array arrangement 1001 thereby allows the sub-beam currents to be controlled, for example by operation of the condenser lens arrangement 403.

In all of the above embodiments, the deflections applied by all of the deflectors, such as the source beam deflectors 603 and manipulator array deflectors 404, may be adjusted as appropriate for aligning source beams with the sub-beam apertures. The deflectors may be operated to achieve alignment for each configuration, e.g. setting, of the condenser lens arrangement 403.

Returning to the embodiment shown in FIG. 6, as described above, a source beam deflector 603 is provided between the source 602 and the condenser lens arrangement 403 for each source 602 that is away from the charged particle optical axis. An advantage of this is that the entry angle of each beam into the condenser lens arrangement 403 may be reduced.

Applying a deflection to a charged particle beam may increase the amount of dispersion (i.e. chromatic aberrations) of the beam. The amount of dispersion caused by a deflector may be dependent on the applied deflection by the deflector, the energy spread of the beam at the deflector and the beam energy at the deflector.

In the arrangement of source beam deflectors 603 and manipulator array deflectors 404 shown in FIG. 6, the beam from each source 602 that is away from the charged particle optical axis is deflected by two deflectors. A potential problem with the specific arrangement shown in FIG. 6 is that the source beam deflectors 603 and manipulator array deflectors 404 each apply deflection components in the same direction. That is to say, each source beam deflector 603 applies a deflection that reduces the angle between the beam path and the charged particle optical axis. Each manipulator array deflector 404 applies a deflection that further reduces the angle between the beam path and the charged particle optical axis. The deflection angles applied by both of the deflectors have the same sign (i.e. polarity). A consequence of the applied deflections to a beam path all having the same polarity is that the dispersion effects caused by each of the applied deflections accumulate. In some applications, the total dispersion caused by all of the applied deflections may be unacceptable.

Embodiments also include techniques for reducing the dispersion effects caused by applying deflections to a beam.

When there are two deflectors on a beam path, if the deflection angle applied by one of the deflectors has an opposite sign to the deflection angle applied by the other deflector, the dispersions caused by each deflector will at least partially cancel each other out. Furthermore, the total dispersion caused by the two deflectors may be minimized if the condition in Eqn. 1 below is met:

$$\left(\frac{\alpha_{d1} \cdot L_{v.source@d1}}{U_{beam.energy@d1}}\right) \approx -\left(\frac{\alpha_{d2} \cdot L_{v.source@d2}}{U_{beam.energy@d2}}\right) \quad \text{Eqn. 1}$$

where:
$\alpha_{d1}$=the deflection angle applied to a beam path by a first deflector;
$\alpha_{d2}$=the deflection angle applied to the same beam path by a second deflector;
$L_{v.source@d1}$=the optical distance between the first deflector and a virtual source of the beam;
$L_{v.source@d2}$=the optical distance between the second deflector and a virtual source of the beam;
$U_{beam.energy@d1}$=the beam energy at the first deflector; and
$U_{beam.energy@d2}$=the beam energy at the second deflector.

Each optical distance may be the distance along a beam path. The location of each source 601, 602 may be considered as the position of a virtual source. Each virtual source is the apparent location of the source of a beam of charged particles from a particular position on a beam path. The presence of optical components, such as lenses and deflectors, in a beam path may result in the location of a virtual source being different from the actual location of the source. Accordingly, the location of each virtual source at a particular position on a beam path is dependent on all of the contributions to the imaging of the charged particles up-beam of the particular position.

So long as the deflection angles applied by the deflectors on a beam path have opposite signs, the net dispersion caused by the deflectors will be lower than the individual dispersion caused by each deflector. To minimize, and preferably substantially reduce to zero, the net dispersion, the magnitude of the applied deflections, optical distances to each virtual source and beam energies may be configured so that condition in Eqn. 1 is substantially met.

A net dispersion may also be minimized, and preferably substantially reduced to zero, when there are more than two deflectors on the same beam path. The dispersion contribution from each deflector may be determined in a similar way to how the dispersion contribution for each deflector is determined in Eqn. 1. So long as all of the deflection angles do not have the same sign, the net dispersion caused by the plurality of deflectors will be reduced. The magnitude of the applied deflections, optical distances to each virtual source and beam energies may also be arranged so that the net dispersion is minimized, and is preferably substantially zero.

Figure 11:
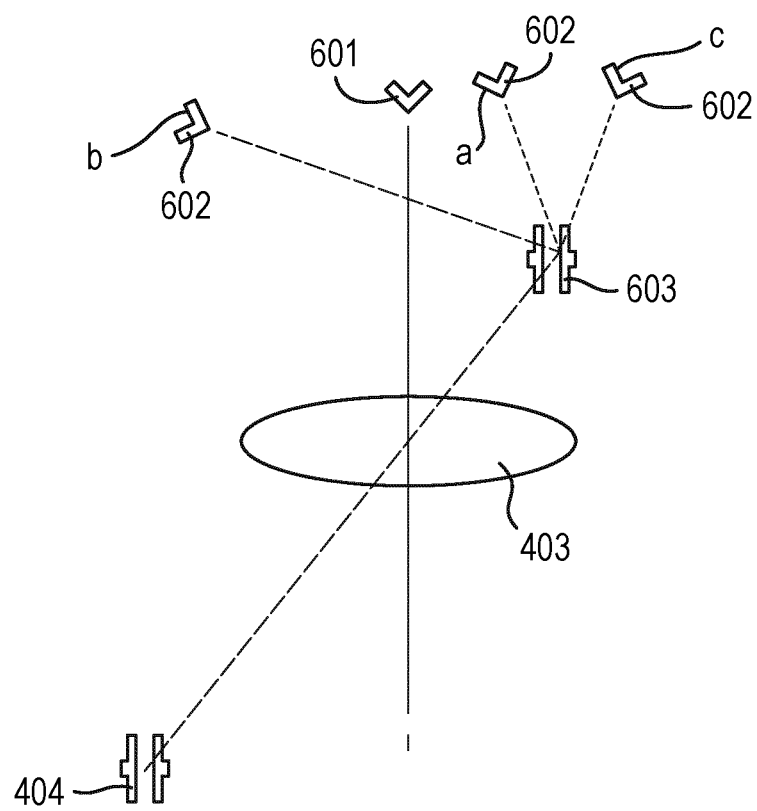
FIG. 11 shows a number of different implementations of part of a multi-source illumination apparatus according to embodiments.

FIG. 11 shows three alternative source/deflector arrangements according to embodiments that improve on the source/deflector arrangement shown in FIG. 6. In FIG. 11, the sources 602 that are not on the charged particle optical axis are all arranged so that their beams are deflected by deflection angles with opposite signs. As explained above, this will at least partially reduce, and may substantially eliminate, dispersive effects caused by the source beam deflectors 603 and manipulator array deflectors 404. In all of the implementations, the beam energies may be the same at each deflector. Alternatively, the beam energies may be controlled so that they different at each deflector in order for desired deflection angles to be used in addition to dispersion cancellation being achieved.

In the implementation indicated by (a) in FIG. 11, one or more sources 602 that are not on the charged particle optical axis are positioned closer to the charged particle optical axis. A potential problem with this solution is that there may not be sufficient space within the apparatus to accommodate the sources 602 close to the charged particle optical axis.

Figure 12:
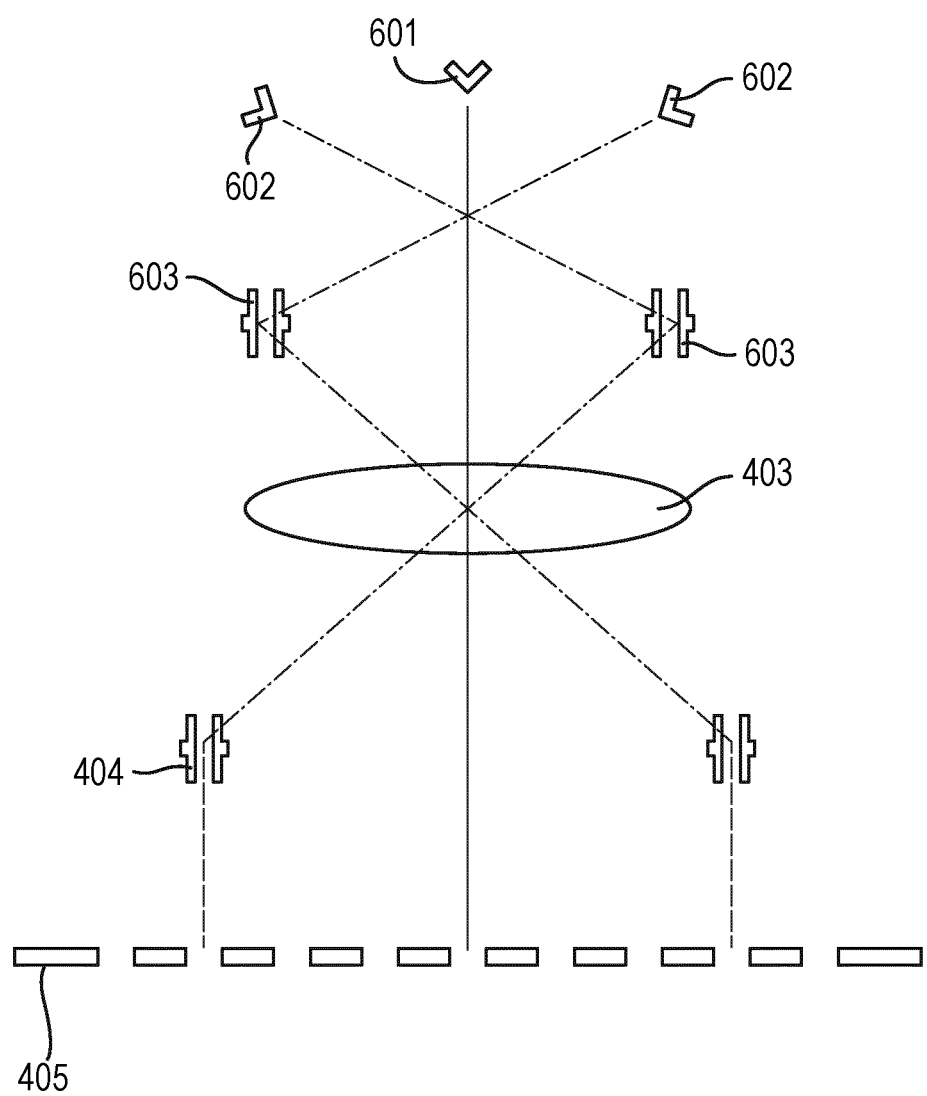
FIG. 12 is a multi-source illumination apparatus according to an embodiment.

In the implementation indicated by (b) in FIG. 11, which is also shown in FIG. 12, the sources 602 that are away from the charged particle optical axis are positioned so that the beam path between each source 602 and corresponding source beam deflector 603 crosses the charged particle optical axis. In the present implementation, differences in the distances to the virtual sources may allow the angular deflection applied by each source beam deflector 603 to be larger than the angular deflection applied by the manipulator array deflector 404. The beam path between the location (b) and deflector 603 may cross the path of a different beam risking an increase in aberrations, such as those derived from Coulomb interactions.

Figure 13:
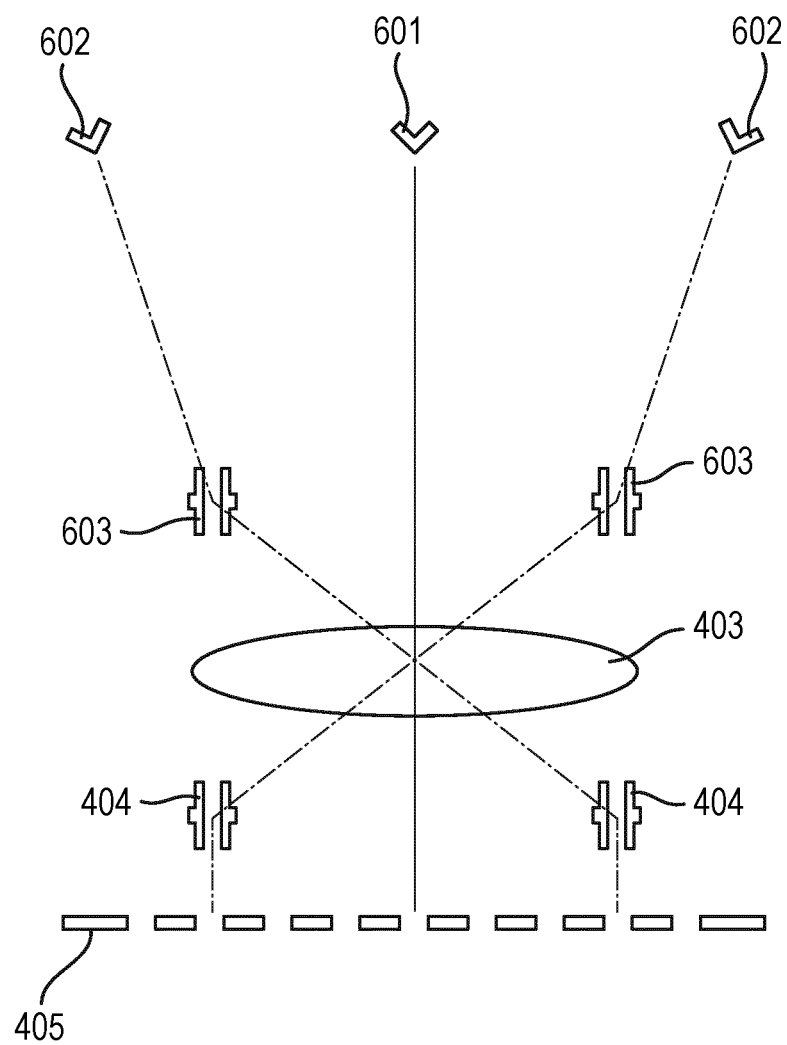
FIG. 13 is a multi-source illumination apparatus according to an embodiment.

In the implementation indicated by (c) in FIG. 11, which is also shown in FIG. 13, the sources 602 that are not on the charged particle optical axis are positioned so that the angular deflection applied by the each source beam deflector 603 is less that that applied by the corresponding manipulator array deflector 404. The beam energy at the source beam deflector 603 may be less than the beam energy at the manipulator array deflector 404.

Embodiments also include other techniques for reducing aberrations in the beams from the sources. The aberration (e.g. dispersion) of a beam caused by a condenser lens arrangement is dependent of the radius of the footprint of the beam on the condenser lens arrangement. The aberrations may therefore be reduced by reducing the footprint of the beam, for example by focusing the beam onto the condenser lens arrangement.

Figure 14:
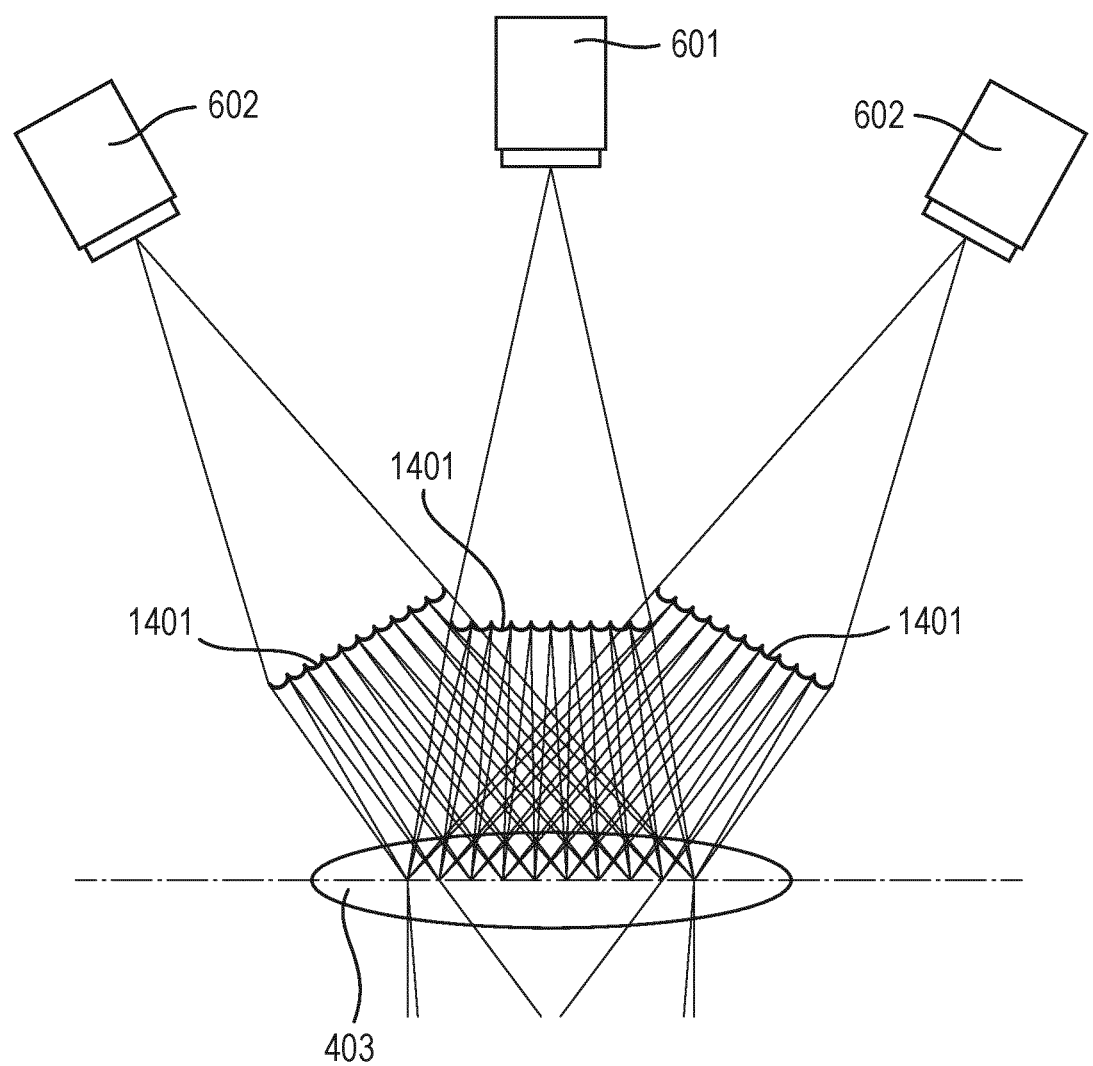
FIG. 14 is part of a multi-source illumination apparatus according to an embodiment.

FIG. 14 shows an embodiment in which a technique is applied for reducing aberrations caused by the condenser lens arrangement 403.

As shown in FIG. 14, a source aperture array 1401 is provided between each source 601, 602 and the condenser lens arrangement 403. Each source aperture array 1401 both generates a plurality of sub-beams in dependence on a received beam and also focusses the sub-beams. The focusing may be performed by a micro-lens respective to with each aperture. Each source aperture array 1401 may therefore comprise a plurality of micro-lenses in a micro-lens array, that may also be referred to as a lens array. Each source aperture array 1401 may be a lens array as disclosed in US2004/0232349 A1, the entire contents of which is incorporated herein by reference.

Due to the decrease in aberrations resulting from focusing sub-beams from each source 601, 602 onto the condenser lens arrangement 403, the sources 601, 602 may be located further from the condenser lens arrangement 403. This may increase the available space within the apparatus for accommodating the sources 601, 602.

Embodiments also may include reducing chromatic aberrations by removing any undesired parts of the beams emitted by each source 601, 602. For each source 601, 602, a corresponding large aperture may be provided down-beam of the condenser lens arrangement 403. Each large aperture may to configured so that the desired multi-beam from a source 601, 602 may pass through it but other beams from the source are substantially blocked.

Aberrations may also be reduced by increasing the beam energies. For example, aberrations may be reduced by accelerating the beams from 30 kV to 200 kV.

Aberrations may also be reduced by using magnetic components instead of electric components. For example, magnetic deflectors may be used instead of electric deflectors.

Figure 15:
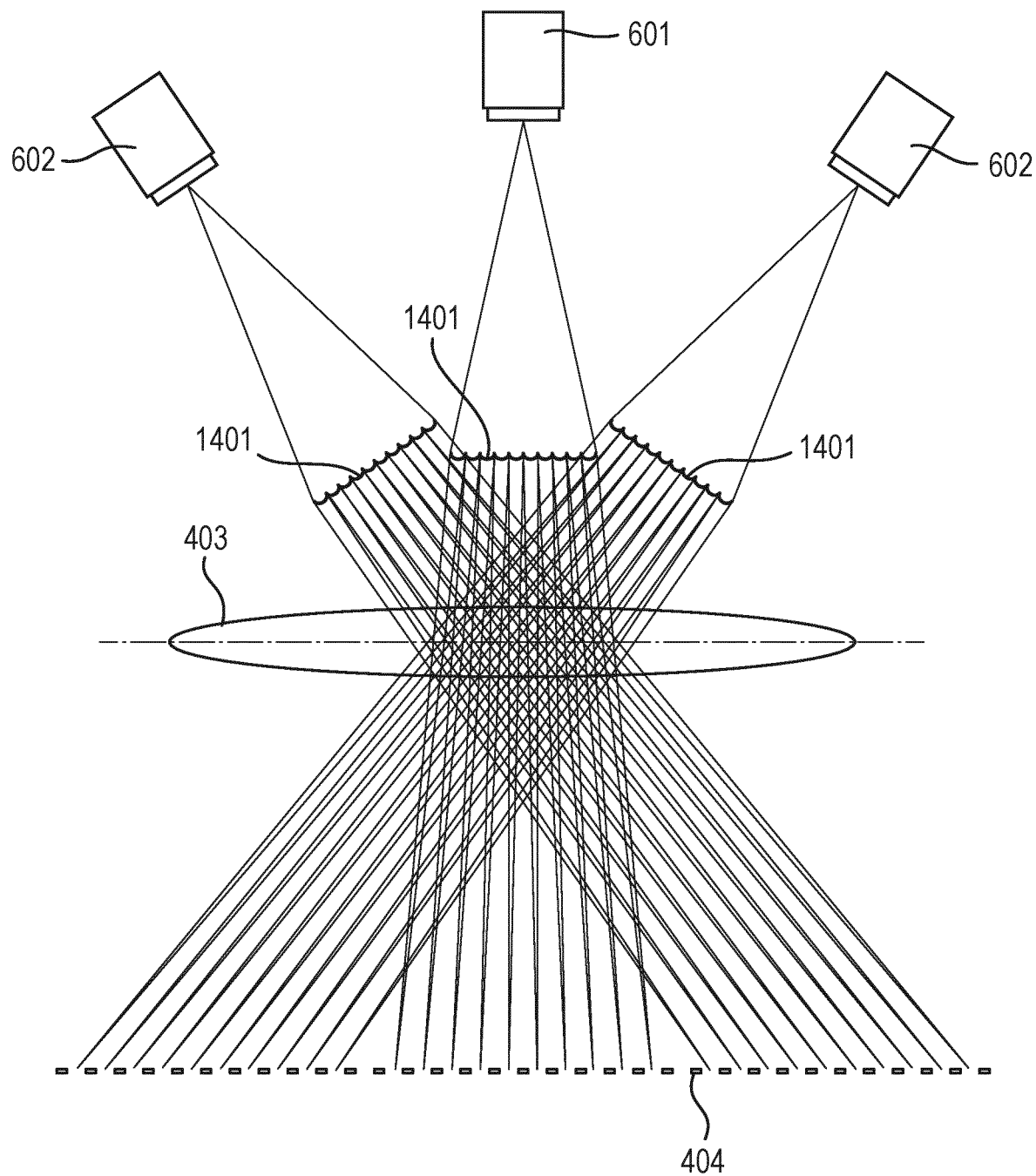
FIG. 15 is a multi-source illumination apparatus according to an embodiment.

FIG. 15 shows another embodiment in which a technique is applied for reducing aberrations.

The embodiment shown in FIG. 15 is similar to that shown in FIG. 14 in that a source aperture array 1401 is provided between each source 601, 602 and the condenser lens arrangement 403. The embodiment shown in FIG. 15 differs from that shown in FIG. 14 in that each source aperture array 1401 is configured to focus sub-beams onto the manipulator array instead of the condenser lens arrangement 403. For example, the sub-beams may be focused onto the manipulator array deflectors 404.

By arranging the source aperture arrays 1401 to focus sub-beams onto the manipulator array deflectors 404, the aberrations caused by manipulator array deflectors 404 are reduced. The aberrations caused by manipulator array deflectors 404 may be larger than those caused by the condenser lens arrangement 403 and so there may be a greater overall reduction in aberrations when the sub-beams are focused onto the manipulator array deflectors 404.

Figure 16:
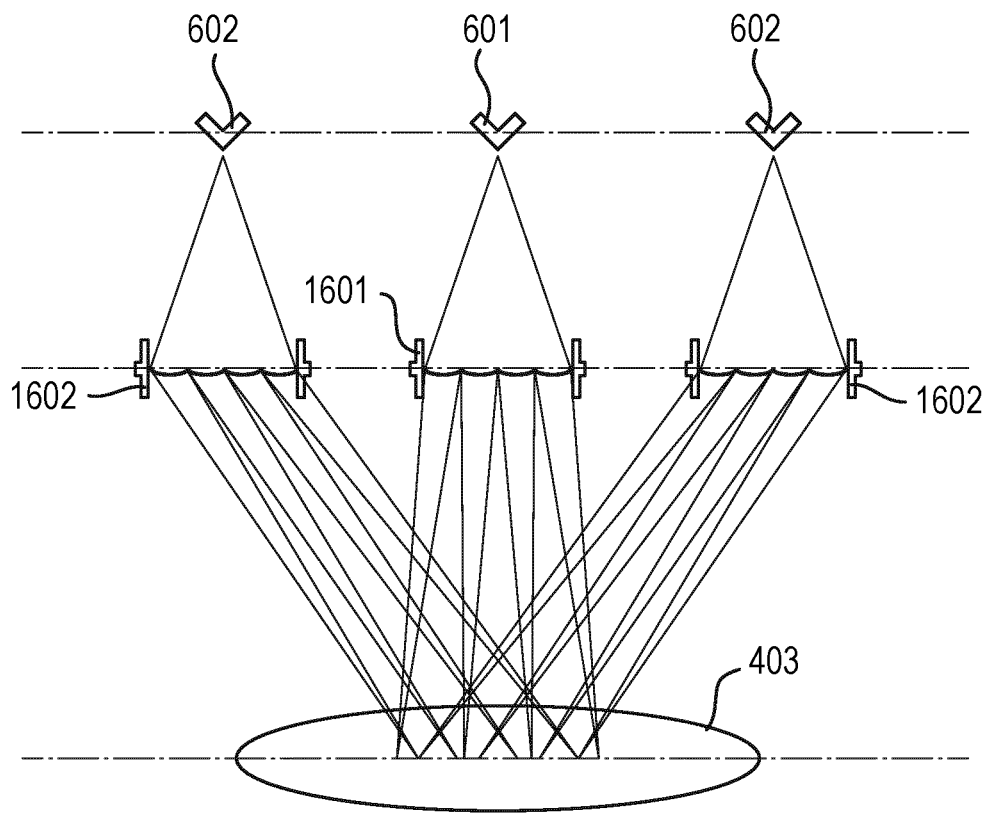
FIG. 16 is part of a multi-source illumination apparatus according to an embodiment.

FIG. 16 shows another embodiment. The apparatus in FIG. 16 comprises source beam manipulators 1601, 1602. Each source beam manipulator 1601, 1602 is arranged between a source 601, 602 and the condenser lens arrangement 403.

Each source beam manipulator 1602 for a source 602 that is off the charged particle optical axis comprises both a source beam deflector and a source aperture array. The source beam deflector may be similar to the above-described source beam deflectors 603 and located up-beam, or down-beam, the source aperture array. If a source beam deflector 603 is located down-beam of the corresponding source aperture array, the source beam deflector may take the form of an array of deflectors each for one, or a group of, sub-beam paths. Each source aperture array may be substantially the same as the source aperture arrays 1401 as described earlier with reference to FIGS. 14 and 15. These source beam manipulators 1602 are arranged to both generate a multi-beam in dependence on a received beam and to apply a deflection so that the multi-beam has a different direction to the received beam by the source beam manipulator 1602.

The source beam manipulator 1601 for the source 601 that is on the charged particle optical axis may comprise a source aperture array but not a source beam deflector. The source aperture array may be substantially the same as the source aperture arrays 1401 as described earlier with reference to FIGS. 14 and 15.

All of the sources 601, 602 may all be aligned in the same plane that is parallel to the plane of the condenser lens arrangement 403. Each source 601, 602 may be arranged to emit a beam in a direction that is parallel to, or along, the charged particle optical axis.

All of the source beam manipulators 1601, 1602 may be aligned in the same plane that is parallel to the plane of the condenser lens arrangement 403. All of the source beam manipulators 1601, 1602 may be comprised by a single source beam manipulator arrangement.

The source beam manipulators 1601, 1602 may focus sub-beams onto the condenser lens arrangement 403 or the manipulator array 404, 405 as described earlier with reference to FIGS. 14 and 15. Advantageously, this may reduce the aberrations in the beams.

Another advantage of the present embodiment is that the deflections applied by the source beam manipulators 1601, 1602 are in an opposite directions to the deflections applied by the manipulator array deflectors 404. As described earlier with reference to FIGS. 11 and 13, this may also reduce the aberrations beams, in particular dispersive effects.

Figure 17:
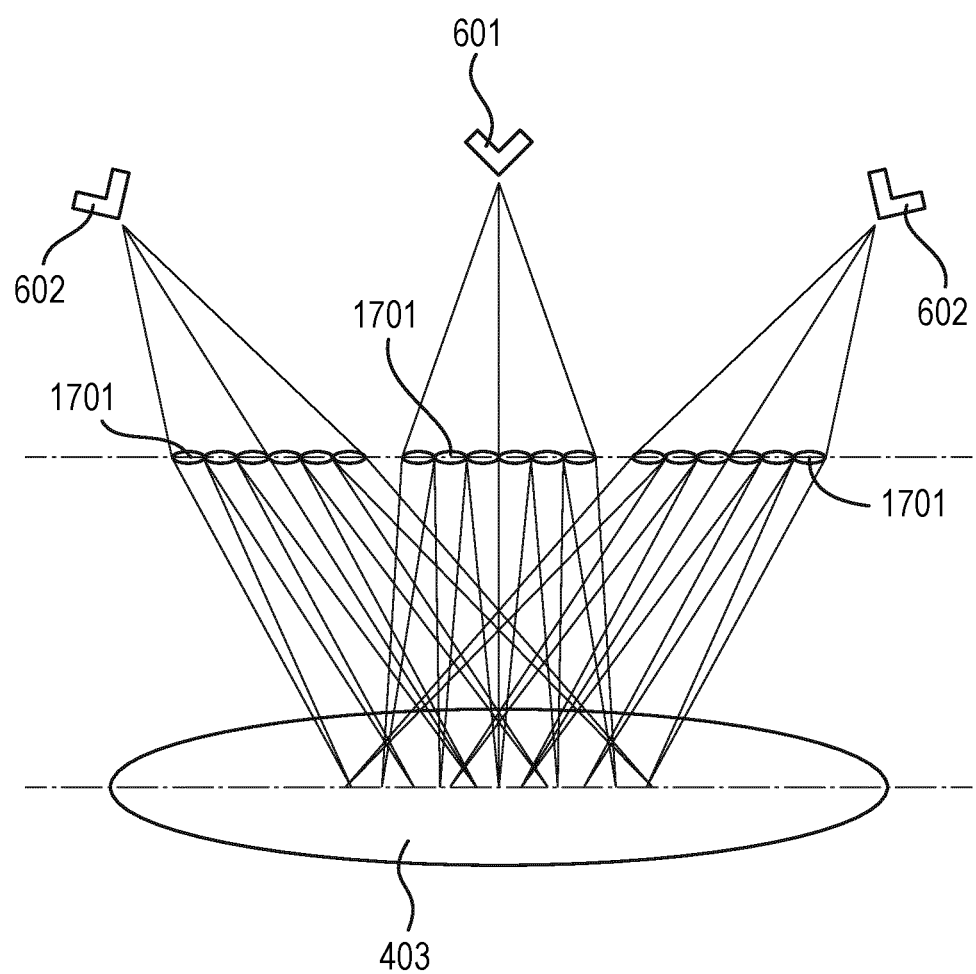
FIG. 17 is part of a multi-source illumination apparatus according to an embodiment.

FIG. 17 shows another embodiment that does not comprise source beam deflectors. The apparatus in FIG. 17 comprises source beam manipulators 1701. Each source beam manipulator 1701 is arranged between a source 601, 602 and the condenser lens arrangement 403. Each source beam manipulator 1701 comprises a source aperture array. The source aperture array may be substantially the same as the source aperture arrays as described earlier with reference to FIGS. 14 and 15.

The source beam manipulators 1701 may focus sub-beams on the condenser lens arrangement 403 or the manipulator array 404, 405 as described earlier with reference to FIGS. 14 and 15. Advantageously, this may reduce the aberrations in the beams.

The present embodiment differs from that shown in FIG. 16 in that none of the source beam manipulators 1701 comprises a deflector. The sources 602 that are not on the charged particle optical axis therefore emit beams that are directed towards the condenser lens arrangement 403.

The apparatus in FIG. 17 is similar to that shown in FIG. 16 in that all of the sources 601, 602 may be arranged in the same plane. All of the source beam manipulators 1701 may be arranged in the same plane. The plane that comprises the sources 601, 602 and the plane that comprises the source beam manipulators 1701 may both be parallel to the plane of the condenser lens arrangement 403. All of the source beam manipulators 1701 may be comprised by a single source beam manipulator arrangement.

As described earlier, a deflector may cause aberrations in the beam that it deflects. These aberrations may be reduced, and preferably substantially eliminated, by using more than one deflector on a beam path arranged so that the beam path comprises a counter deflection.

To elaborate further on the conditions in Eqn. 1 for reducing, and preferably substantially eliminating, the net aberrations caused by deflectors, the optical distances, i.e. $L_{v.source@d1}$ and $L_{v.source@d2}$, are not restricted to being the optical distances to a virtual source. The optical distances for substantially eliminating the net aberrations may additionally, or alternatively, be defined as the optical distance from each deflector to a common focus point or intermediate point. The common focus point, or intermediate point, may not be a virtual source and may instead be an image of a virtual source. In particular, in order to calculate the total dispersion it is necessary to add the dispersion of the various dispersive elements. Dispersive elements include deflectors and lenses. Each optical distance may be between a dispersive element and either a virtual source or an image of a virtual source.

Embodiments include variations on the embodiments as shown in FIGS. 16 and 17. For each source that is not on the charged particle optical axis, a deflector set comprising a plurality of deflectors may be provided. The deflectors in each deflector set may be further deflectors along a beam path to the manipulator array deflector 404. The deflector set may, for example, comprise at least two deflectors. In a system with two deflectors, the deflectors may be located:
  a) Both up-beam a source beam manipulator. One of the deflectors may be comprised by the source beam manipulator.
  b) Both down-beam a source beam manipulator. One of the deflectors may be comprised by the source beam manipulator
  c) One up-beam of a source beam manipulator and one down-beam of the source beam manipulator. One of the deflectors may be comprised by the source beam manipulator.
  d) One up-beam of the source beam manipulator, down-beam of the source beam manipulator or comprised by a source beam manipulator and the other down-beam of the condenser lens.

In a system of three or more deflectors, the deflectors may be located at any of the positions mentioned for a two deflector set. Preferably the net dispersion for all deflectors (together with other dispersive elements along the beam path is zero or otherwise minimized.

Figure 18:
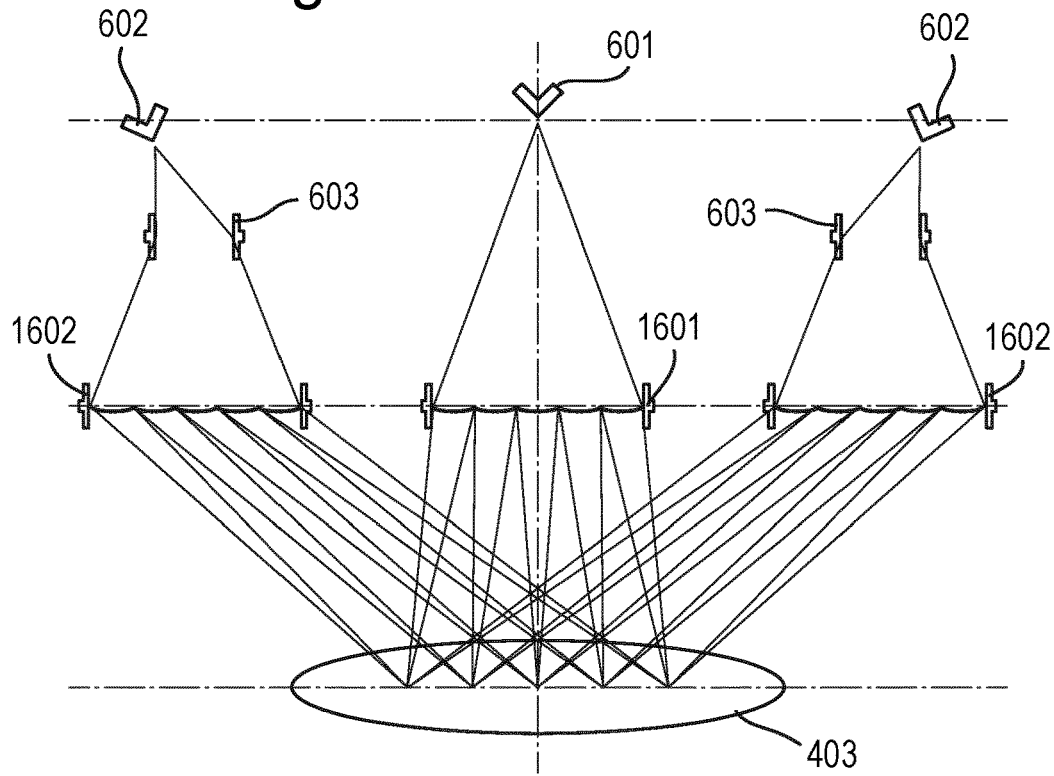
FIG. 18 is part of a multi-source illumination apparatus according to an embodiment.

FIG. 18 shows an embodiment in which the embodiment shown in FIG. 16 has been modified by the techniques according to a) above. That is to say, an additional deflector is located between each source 602 and the corresponding source beam manipulator 1602. The arrangement shown with respect to FIG. 16 may be modified to achieve the arrangement of FIG. 18 so that the sources may be away from a common plane that may be orthogonal to the charged particle axis. Alternatively, FIG. 18 may be considered to be a modification of FIG. 17. These differences are described later in this description.

The embodiment shown in FIG. 18 may comprise all of the components of the embodiment shown in FIG. 16. The sources 602, 601 may be arranged in substantially the same plane. However, the use of deflectors 603 may alternatively permit the sources 602, 601 to be away from a common plane. The source beam manipulators 1601, 1602 shown in FIG. 18 may be substantially the same as the source beam manipulators 1601, 1602 shown in FIG. 16. The deflectors associated with the source beam manipulators 1603 may be either down-beam or up-beam of the source beam manipulators 1602.

For each source 602 that is off the charged particle optical axis, the embodiment shown in FIG. 18 may comprise a source beam deflector 603 between the source 602 and the source beam manipulator 1602. The source beam deflector 603 and corresponding source beam manipulator 1602 apply counter deflection to the same beam path and this configuration may reduce, preferably minimize, aberrations.

With regard to applying the conditions for eliminating dispersive effects to the arrangement shown in FIG. 18, the dispersive elements may be the source beam deflectors 603, the condenser lens arrangement 403 and the source beam manipulators 1602. Although the apparatus may also comprise a manipulator array deflector 404, the dispersive contribution of this may be avoided, or negligible, due to the source beam manipulators 1601, 1602 being arranged to focus sub-beams onto the manipulator array deflector 404.

For each source beam deflector 603 the optical distance is the distance to the virtual source 602. For the condenser lens arrangement 403, the optical distance is the image of the virtual source. This is in the same plane as the condenser lens arrangement 403 and so this distance is zero. For each source beam manipulator 1602, either the optical distance to the virtual source 602 or the optical distance to the image of the virtual source in the plane of the condenser lens arrangement 403 may be taken.

With regard to adding up dispersive contributions in different images of the virtual source (i.e. the virtual source 602 and the intermediate image in the plane of the condenser lens 403), these images are in conjugate planes (i.e. they are an image of each other) and there is a magnification factor in between. By multiplying with the relevant magnification factor between these planes, the dispersions may be transferred to the same virtual source, or images. It does not matter which virtual source or image the dispersions are transferred to, so long as all dispersive contributions are calculated with respect to the same image.

For example, for each source beam manipulator 1602, the optical distance may be to the virtual source 602 or to the intermediate image in the plane of the condenser lens arrangement 403. The magnification from virtual source 602 to the intermediate image in the plane of the condenser lens arrangement 403 is given by the ratio of the optical distance from virtual source 602 to the source beam manipulator 1602, and the optical distance from source beam manipulator 1602 to the intermediate image in the plane of the condenser lens arrangement 403.

In the present embodiment, at least one of the sources 601, 601 may not all be in same plane. That is, at least one of the sources 601, 601 may away common plane of some of the other sources.

The source beam manipulators 1601, 1602 may be arranged to focus sub-beams onto the condenser lens arrangement 403 or a manipulator array deflector 404 (not shown in FIG. 18). As described earlier with reference to FIGS. 14 and 15, this may reduce aberrations. In particular, by focusing sub-beams onto the manipulator array deflector 404, the aberrations caused by this deflection may be substantially avoided.

The embodiment shown in FIG. 17 may also be modified by the above-described techniques to achieve the configuration of FIG. 18. That is, a pair of deflectors are added [as (a)] with one deflector up beam of the source beam manipulator and the other associated with the source beam manipulator 1602; for example the deflector associated with the source beam manipulator may be up-beam, down-beam or in the source beam manipulator 1602. If the source beam manipulator array of FIG. 17 is used in the arrangement in FIG. 18, the deflector associated with the source beam manipulator 1602 may be down beam of the manipulator.

In modifying the embodiment of FIG. 17, the apertures in the source aperture arrays of the source beam manipulators 1701 should be capable of receiving an angled, i.e. non-orthogonal, beam from sources 602 that are not on the charged particle optical axis. This may also be a requirement in the embodiments shown in FIGS. 16 and 18, for example when the deflectors comprised by the source beam manipulators 1602 are located up-beam of the source aperture arrays of the source beam manipulators 1602.

The apertures in the source aperture arrays that receive angled beams may be:
  sufficiently small so that the aberrations caused by the micro-lenses in each source beam manipulator is negligibly small, and/or
  each aperture may be configured so that it receives the same electron intensity, i.e. current. The dimensions of the apertures may therefore increase as the distance of the apertures from the charged particle optical axis increases.

The apertures, or openings, in the source aperture arrays that receive angled beams may be shaped, such as elliptically shaped. The elliptically shaped openings may be shaped to have a varying radius with a maximum and minimum radius. The maximum radius may be aligned with direction of the beam path relative to the orthogonal of the source aperture array. The shape of the apertures may reduce the aberrations caused by micro-lenses so that these aberration are negligible. The sub-beams generated by the apertures may also have a similar shape.

Figure 19:
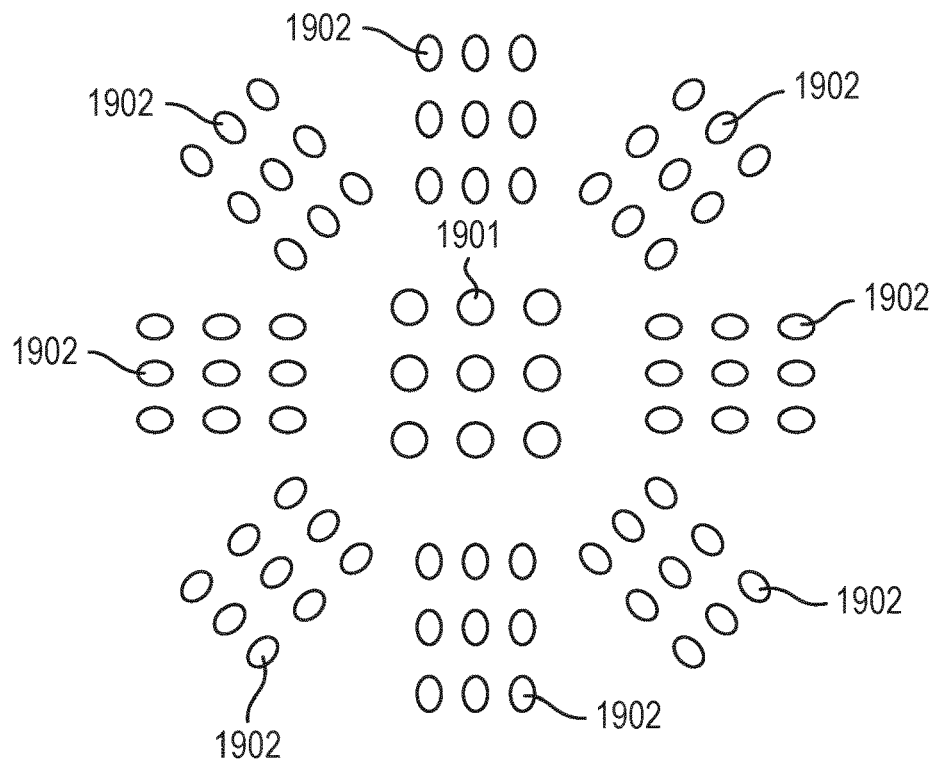
FIG. 19 is part of a multi-source illumination apparatus according to an embodiment.

FIG. 19 shows a plan view of how the apertures in source aperture arrays may be orientated.

In the embodiment shown in FIG. 19, there are nine respective source aperture arrays. Each source aperture array may correspond to one of nine respective sources (not shown in FIG. 19). In this embodiment, the sources may be arranged in a square grid.

Source aperture array 1901 is located on the charged particle optical axis. All of the other source aperture arrays 1902 are located away from the charge particle axis.

As shown in FIG. 19, the apertures of the source aperture array 1901 that is located on the charged particle optical axis may all substantially be circular. The apertures of the source aperture arrays 1902 that are not located on the charge particle axis may be elliptical. The major axis of all of the elliptical apertures may be directed towards the charged particle optical axis.

Aspects of all of the above-described embodiments may be applied together in the same apparatus. In particular, although not shown in all of the figures, apparatuses according to embodiments may all comprise a manipulator array 404, 405 as shown in FIGS. 4 and 6, or a manipulator array arrangement 1001 as shown in FIG. 10B.

In the above-described embodiments, source beam deflectors 603, source aperture arrays 1401 and source beam manipulators 1601, 1602, 1701 are all referred to. Each of these components may more generally be referred to as a source beam manipulator arrangement.

In all of the embodiments described herein, each condenser lens 403, and/or condenser lens arrangement 403, may be configured to approximately, or substantially, collimate each received beam and each received beam may not be perfectly collimated. Each condenser lens arrangement may be the same as, or comprise components of, the condenser arrangements as described above with reference to FIGS. 2 and 3.

In all of the above embodiments, adjustments applied to the condenser lens arrangement 403, such as the movement of the condenser lens arrangement 403, and/or of condenser lenses within the condenser lens arrangement 403, may result in a rotation of the beams. This rotation may not require correcting, in particular if the rotation occurs prior to each beam being used to generate a multi-beam. However, embodiments also include applying known techniques for correcting for, or avoiding, beam rotation by the condenser lens arrangement 403. For example, the techniques disclosed in EP3563400A1 may be applied.

Embodiments have been described with reference to charged particles. The charged particles may be electrons or other types of charged particle, such as protons.

Advantageously, the multi-source illumination apparatus according to embodiments allows a multi-beam to be generated in dependence on a plurality of sources 401. The use of plurality of sources 401 allows a relatively large illumination area at the input to a manipulator system to be achieved. Due to the use of a plurality of sources 401, the extent to which the charged particles at the illumination area are off-axis from their source 401 is relatively small. The aberrations are therefore lower than if a single source is used to provide the same illumination area.

In addition, the use of a plurality of sources 401 allows an increased total current to be provided than with a single source apparatus. The number of sub-beams achievable in a multi-beam is therefore less restricted than with a single source apparatus.

The use of a single condenser lens 403, or single condenser lens arrangement 403, as well as a single manipulator system provides a single column apparatus. This is advantageous over apparatuses that comprise a plurality of columns that experience a greater problem with space restrictions and, in particular, experience the problem of increased aberrations due to using smaller condenser lenses.

A scanning device according to embodiments only requires a small volume because it is a single column projection apparatus.

The multi-source illumination apparatus according to embodiments may be used in a number of different applications that include electron microscopy in general, not just SEM, and lithography.

For example, embodiments include a multi-beam inspection and/or metrology tool that comprises the above-described the multi-source illumination apparatus according to embodiments. The multi-source illumination apparatus may be part of a scanning device arranged to project a multi-beam of charged particles onto a sample. The multi-beam inspection tool may comprise a detector that is arranged to detect charged particles, such as secondary electrons, that are received from the illuminated sample.

Embodiments also include a multi-beam lithography tool that comprises the above-described multi-source illumination apparatus according to embodiments. The multi-source illumination apparatus may be arranged to illuminate a resist on a substrate.

Embodiments include a number of modifications and variations to the techniques described above.

In particular, the multi-source illumination apparatus according to embodiments may comprise any of the components of the apparatuses described above with reference to FIGS. 1, 2 and 3.

Throughout embodiments a charged particle optical axis is described. This axis describes the path of charged particles through and output from the illumination apparatus. The sub-beams of an output multi-beam may all be substantially parallel to the charged particle optical axis. The charged particle optical axis may be the same as, or different from, a mechanical axis of the illumination apparatus.

According to a first aspect of the invention, there is provided a multi-source illumination apparatus for illuminating a sample with charged particles, the apparatus comprising: a plurality of sources that are each arranged to emit a beam of charged particles; a condenser lens arranged to receive beams from the plurality of sources; and a manipulator array arrangement configured to receive beams that have passed through the condenser lens; wherein: the beams are arranged such that, at a plane of the condenser lens, a beam from at least one source intersects with at least part of one other beam from a different one of the plurality of sources; the condenser lens is configured to separately substantially collimate the received beams from each source; and the manipulator array arrangement is configured to manipulate the beams that have been substantially collimated by the condenser lens to thereby generate one or more beams, in a single column, that comprise charged particles from the plurality of sources.

Preferably, the manipulator array arrangement comprises a deflector array that is arranged to deflect the beams that have been substantially collimated by the condenser lens to thereby generate a plurality of substantially parallel substantially collimated beams that comprise charged particles from the plurality of sources.

Preferably, the manipulator array arrangement further comprises a multi-beam generator, wherein the multi-beam generator is configured to: receive the plurality of substantially parallel substantially collimated beams generated by the deflector array; and generate a multi-beam in dependence on the received plurality of substantially parallel substantially collimated beams, wherein the multi-beam comprises a plurality of substantially collimated sub-beams.

Preferably, the manipulator array arrangement is configured to manipulate at least one of the sub-beams.

Preferably, the manipulator array arrangement is configured to manipulate at least one of the sub-beams by applying, to at least one of the sub-beams, one or more of a focus, deflection, change of cross-sectional shape and blanking.

Preferably, the manipulator array arrangement comprises at least one micro-electro-mechanical system, MEMS.

Preferably, the multi-beam is a rectangular, square, rhombic or hexagonal array of sub-beams.

Preferably, the multi-beam is an N by N substantially square array of sub-beams; and N is 3, 5, 6, 11, 12 or 70.

Preferably, the method further comprises a coulomb aperture array, wherein: the coulomb aperture array is arranged in the paths of the beams between the plurality of sources and the condenser lens; and the coulomb aperture array is arranged to receive a single beam from one or more of the sources and, for each received single beam, to output a multi-beam in dependence on the received single beam, with each output multi-beam by the coulomb aperture array comprising a plurality of sub-beams of charged particles, such that the condenser lens receives and substantially collimates one or more multi-beams and the manipulator array arrangement manipulates one or more multi-beams.

Preferably, the plane of the condenser lens is substantially orthogonal to the charged particle optical axis of the apparatus.

Preferably, the plurality of substantially parallel collimated beams output from the deflector array are substantially parallel with the charged particle optical axis of the apparatus.

Preferably, a beam from each source intersects in said plane of the condenser lens with a beam from each of the other sources.

Preferably, beams from a plurality of sources intersect at a mid-point in said plane of the condenser lens.

Preferably, each of one or more of the sources comprises a controller for controlling the emission current of the emitted beam of charged particles by the source.

Preferably, each of one or more of the sources comprises a controller of the emission opening angle of the source.

Preferably, each source comprises an aperture arranged to impart a shape on the beam emitted by the source; and the aperture comprises one or more openings, the substantial shape of the one or more openings being rectangular, square, round, linear slots, banana shaped and/or curved lines.

Preferably, the condenser lens is comprised by a condenser lens arrangement; and the condenser lens arrangement comprises a plurality of lenses arranged in series such that one or more of the beams passes through a plurality of lenses in the condenser lens arrangement.

Preferably, two or more of the sources are arranged symmetrically about the charged particle optical axis of the apparatus.

Preferably, the number of sources is two, three, four, five, eight, nine, ten, sixteen, seventeen, twenty-five, twenty-six, thirty-four or thirty-five.

Preferably, wherein all of the sources are arranged in a plane that is substantially orthogonal to the charged particle optical axis of the apparatus.

Preferably, the sources are all arranged substantially equidistant from a mid-point of the region on the plane of the condenser lens where the beams intersect.

Preferably, the manipulator array arrangement has a beam input and the beam from each source is arranged such that, at the beam input and in a plane that is substantially orthogonal to the charged particle optical axis, the illumination area of the beam substantially abuts one or more other illumination areas of beams from other sources.

Preferably, at the beam input, and in a plane that is substantially orthogonal to the charged particle optical axis, each illumination area of a beam does not substantially overlap with an illumination area of another beam.

Preferably, the charged particles are electrons.

According to a second aspect of the invention, there is provided a multi-beam inspection tool comprising: the multi-source illumination apparatus according to the first aspect, wherein the multi-source illumination apparatus is arranged to illuminate a sample; and a detector arranged to detect charged particles received from the illuminated sample.

According to a third aspect of the invention, there is provided a multi-beam lithography tool comprising the multi-source illumination apparatus according to the first aspect, wherein the multi-source illumination apparatus is arranged to illuminate a resist on a substrate.

According to a fourth aspect of the invention, there is provided a multi-source illumination apparatus for generating a multi-beam of charged particles, the apparatus comprising: a plurality of sources that are each arranged to emit a beam of charged particles; and a manipulator array arrangement that comprises a beam input and a beam output; wherein: the beam input is configured to receive beams from the plurality of sources; the beams are arranged such that, at the beam input and in a plane that is substantially orthogonal to the charged particle optical axis, the illumination area of each beam substantially abuts the illumination area one or more other beams; and the manipulator array arrangement is configured so that a multi-beam of charged particles is output from the beam output in a single column.

Preferably, at the beam input, and in a plane that is substantially orthogonal to the charged particle optical axis, each illumination area does not substantially overlap with any of the other illumination areas.

Preferably, the beams are arranged so that the beams from all of the sources cross-over each other at one or more positions along the charged particle optical axis before the beams reach the beam input.

Preferably, the beams from all of the sources cross-over each other in substantially the same region in a plane that is orthogonal to the charged particle optical axis.

Preferably, the method further comprises a condenser lens provided in the region in the plane where the beams cross-over each other; and, optionally, the beams cross-over each other at the mid-point of the condenser lens.

Preferably, the beam input is the input of a deflector array.

According to a fifth aspect of the invention, there is provided a method of generating one or more beams of charged particles for illuminating a sample, the method comprising: emitting, by each of a plurality of sources, a beam of charged particles such that the beams at least partially intersect; substantially collimating the beams from each source at position along the charged particle optical axis where the beams at least partially intersect; manipulating the substantially collimated beams to thereby generate one or more beams, in a single column, that comprise charged particles from the plurality of sources.

Preferably, the method further comprises generating a multi-beam of charged particles; and illuminating a sample with the multi-beam.

Preferably, the method is performed in an apparatus according to the first aspect.

According to a sixth aspect of the invention, there is provided a multi-source illumination apparatus for illuminating a sample with charged particles, the apparatus comprising: a plurality of sources; a condenser lens arrangement configured to receive a beam of charged particles from each source and to separately substantially collimate the beams from each source; at least one source beam manipulator arrangement, wherein each source beam manipulator arrangement is arranged between a source and the condenser lens arrangement and configured to operate on the beam therebetween; and a manipulator array arrangement configured to receive beams that have passed through the condenser lens arrangement and to generate a single multi-beam of charged particles from the plurality of sources.

While the present invention has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The following clauses are representative of certain embodiments of the invention as disclosed herein.

Clause 1: A multi-source illumination apparatus for illuminating a sample with charged particles, the apparatus comprising: a plurality of sources that are each arranged to emit a beam of charged particles; a condenser lens arranged to receive beams from the plurality of sources; and a manipulator array arrangement configured to receive beams that have passed through the condenser lens; wherein: the beams are arranged such that, at a plane of the condenser lens, a beam from at least one source intersects with at least part of one other beam from a different one of the plurality of sources; the condenser lens is configured to separately substantially collimate the received beams from each source; and the manipulator array arrangement is configured to manipulate the beams that have been substantially collimated by the condenser lens to thereby generate one or more beams, in a single column, that comprise charged particles from the plurality of sources.

Clause 2: The apparatus according to clause 1, wherein the manipulator array arrangement comprises a deflector array that is arranged to deflect the beams that have been substantially collimated by the condenser lens to thereby generate a plurality of substantially parallel substantially collimated beams that comprise charged particles from the plurality of sources.

Clause 3: The apparatus according to claim 2, wherein the manipulator array arrangement further comprises a multi-beam generator, wherein the multi-beam generator is configured to:
receive the plurality of substantially parallel substantially collimated beams generated by the deflector array; and generate a multi-beam in dependence on the received plurality of substantially parallel substantially collimated beams, wherein the multi-beam comprises a plurality of substantially collimated sub-beams.

Clause 4: The apparatus according to any preceding clause, wherein the manipulator array arrangement is configured to manipulate at least one of the sub-beams.

Clause 5: The apparatus according to clause 4, wherein the manipulator array arrangement is configured to manipulate at least one of the sub-beams by applying, to at least one of the sub-beams, one or more of a focus, deflection, change of cross-sectional shape and blanking.

Clause 6: The apparatus according to clause 4 or 5, wherein the manipulator array arrangement comprises at least one micro-electro-mechanical system, MEMS.

Clause 7: The apparatus according to any of clauses 3 to 6, wherein the multi-beam is a rectangular, square, rhombic or hexagonal array of sub-beams.

Clause 8: The apparatus according to clause 7, wherein the multi-beam is an N by N substantially square array of sub-beams; and N is 3, 5, 6, 11, 12 or 70.

Clause 9: The apparatus according to any preceding clause, further comprising a coulomb aperture array, wherein: the coulomb aperture array is arranged in the paths of the beams between the plurality of sources and the condenser lens; and the coulomb aperture array is arranged to receive a single beam from one or more of the sources and, for each received single beam, to output a multi-beam in dependence on the received single beam, with each output multi-beam by the coulomb aperture array comprising a plurality of sub-beams of charged particles, such that the condenser lens receives and substantially collimates one or more multi-beams and the manipulator array arrangement manipulates one or more multi-beams.

Clause 10: The apparatus according to any preceding clause, wherein: the plane of the condenser lens is substantially orthogonal to the charged particle optical axis of the apparatus.

Clause 11: The apparatus according to any of clauses 2 to 10, wherein the plurality of substantially parallel collimated beams output from the deflector array are substantially parallel with the charged particle optical axis of the apparatus.

Clause 12: The apparatus according to any preceding clause, wherein a beam from each source intersects in said plane of the condenser lens with a beam from each of the other sources.

Clause 13: The apparatus according to any preceding clause, wherein beams from a plurality of sources intersect at a mid-point in said plane of the condenser lens.

Clause 14: The apparatus according to any preceding clause, wherein each of one or more of the sources comprises a controller for controlling the emission current of the emitted beam of charged particles by the source.

Clause 15: The apparatus according to any preceding clause, wherein each of one or more of the sources comprises a controller of the emission opening angle of the source.

Clause 16: The apparatus according to any preceding clause, wherein each source comprises an aperture arranged to impart a shape on the beam emitted by the source; and the aperture comprises one or more openings, the substantial shape of the one or more openings being shaped as rectangular, square, round, in the form of linear slots, in the form of curved lines and/or having the geometrical shape of a banana.

Clause 17: The apparatus according to any preceding clause, wherein the condenser lens is comprised by a condenser lens arrangement; and the condenser lens arrangement comprises a plurality of lenses arranged in series such that one or more of the beams passes through a plurality of lenses in the condenser lens arrangement.

Clause 18: The apparatus according to any preceding clause, wherein two or more of the sources are arranged symmetrically about the charged particle optical axis of the apparatus.

Clause 19: The apparatus according to any preceding clause, wherein the number of sources is two, three, four, five, eight, nine, ten, sixteen, seventeen, twenty-five, twenty-six, thirty-four or thirty-five.

Clause 20: The apparatus according to any preceding clause, wherein all of the sources are arranged in a plane that is substantially orthogonal to the charged particle optical axis of the apparatus.

Clause 21: The apparatus according to any of clauses 1 to 19, wherein the sources are all arranged substantially equidistant from a mid-point of the region on the plane of the condenser lens where the beams intersect.

Clause 22: The apparatus according to any preceding clause, wherein the manipulator array arrangement has a beam input and the beam from each source is arranged such that, at the beam input and in a plane that is substantially orthogonal to the charged particle optical axis, the illumination area of the beam substantially abuts one or more other illumination areas of beams from other sources.

Clause 23: The apparatus according to clause 22, wherein at the beam input, and in a plane that is substantially orthogonal to the charged particle optical axis, each illumination area of a beam does not substantially overlap with an illumination area of another beam.

Clause 24: The apparatus according to any preceding clause, wherein the charged particles are electrons.

Clause 25: A multi-source illumination apparatus for generating a multi-beam of charged particles, the apparatus comprising: a plurality of sources that are each arranged to emit a beam of charged particles; and a manipulator array arrangement that comprises a beam input and a beam output; wherein: the beam input is configured to receive beams from the plurality of sources; the beams are arranged such that, at the beam input and in a plane that is substantially orthogonal to the charged particle optical axis, the illumination area of each beam substantially abuts the illumination area one or more other beams; and the manipulator array arrangement is configured so that a multi-beam of charged particles is output from the beam output in a single column.

Clause 26: The apparatus according to clause 25, wherein at the beam input, and in a plane that is substantially orthogonal to the charged particle optical axis, each illumination area does not substantially overlap with any of the other illumination areas.

Clause 27: The apparatus according to clause 25 or 26, wherein, the beams are arranged so that the beams from all of the sources cross-over each other at one or more positions along the charged particle optical axis before the beams reach the beam input.

Clause 28: The apparatus according to clause 27, wherein the beams from all of the sources cross-over each other in substantially the same region in a plane that is orthogonal to the charged particle optical axis.

Clause 29: The apparatus according to clause 28, further comprising a condenser lens provided in the region in the plane where the beams cross-over each other; and, optionally, the beams cross-over each other at the mid-point of the condenser lens.

Clause 30: The apparatus according to any of clauses 25 to 29, wherein the beam input is the input of a deflector array.

Clause 31: A multi-beam inspection and/or metrology tool comprising:
the multi-source illumination apparatus according to any preceding clause, wherein the multi-source illumination apparatus is arranged to illuminate a sample; and
a detector arranged to detect charged particles received from the illuminated sample.

Clause 32: A multi-beam lithography tool comprising the multi-source illumination apparatus according to any of clauses 1 to 30, wherein the multi-source illumination apparatus is arranged to illuminate a resist on a substrate.

Clause 33: A method of generating one or more beams of charged particles for illuminating a sample, the method comprising: emitting, by each of a plurality of sources, a beam of charged particles such that the beams at least partially intersect; substantially collimating the beams from each source at position along the charged particle optical axis where the beams at least partially intersect; manipulating the substantially collimated beams to thereby generate one or more beams, in a single column, that comprise charged particles from the plurality of sources.

Clause 34: The method according to clause 33, wherein the method further comprises generating a multi-beam of charged particles; and illuminating a sample with the multi-beam.

Clause 35: The method according to clause 33 or 34, wherein the method is performed in an apparatus according to any of clauses 1 to 30.

The following further clauses are also representative of certain embodiments of the invention as disclosed herein.

Further clause 1: A multi-source illumination apparatus for illuminating a sample with charged particles, the apparatus comprising: a plurality of sources; a condenser lens arrangement configured to receive a beam of charged particles from each source and to separately substantially collimate the beams from each source; at least one source beam manipulator arrangement, wherein each source beam manipulator arrangement is arranged between a source and the condenser lens arrangement and configured to operate on the beam therebetween; and a manipulator array arrangement configured to receive beams that have passed through the condenser lens arrangement and to generate a single multi-beam of charged particles from the plurality of sources.

Further clause 2: The apparatus according to further clause 1, wherein the manipulator array arrangement is arranged to apply a deflection to the beam paths one or more of the plurality of sources.

Further clause 3: The apparatus according to further clause 1 or 2, wherein the manipulator array arrangement is substantially planar; and a charged particle optical axis of the apparatus is a substantially orthogonal axis to the plane of the manipulator array arrangement.

Further clause 4: The apparatus according to any preceding further clause wherein the path of the beam emitted from at least one of the sources is substantially along, or substantially parallel to, the charged particle optical axis.

Further clause 5: The apparatus according to any preceding further clause, wherein each source beam manipulator arrangement comprises a deflector for deflecting a beam path.

Further clause 6: The apparatus according to further clause 5, wherein: each source beam manipulator arrangement is configured to deflect a beam path by a first deflection angle; and the manipulator array arrangement is configured to deflect each beam path that has been deflected by a source beam manipulator arrangement by a second deflection angle.

Further clause 7: The apparatus according to further clause 6, wherein, for each beam path that comprises first and second deflection angles, each first deflection angle has an opposite sign to the second deflection angle.

Further clause 8: The apparatus according to further clause 6 or 7, wherein, for each beam path that comprises first and second deflection angles: the first deflection angle comprises a deflection component that is orthogonal to a charged particle optical axis; and the second deflection angle comprises a deflection component that is orthogonal to a charged particle optical axis and in the opposite direction to that of the first deflection angle.

Further clause 9: The apparatus according to any of further clauses 5 to 8, wherein for each source beam manipulator arrangement, the source beam manipulator arrangement and the manipulator array arrangement are configured so that:

$$\left(\frac{\alpha_{d1} \cdot L_{v.source@d1}}{U_{beam.energy@d1}}\right) \approx -\left(\frac{\alpha_{d2} \cdot L_{v.source@d2}}{U_{beam.energy@d2}}\right)$$

where:
- $\alpha_{d1}$=the deflection angle applied to a beam path by the source beam manipulator arrangement;
- $\alpha_{d2}$=the deflection angle applied to the same beam path by the manipulator array arrangement;
- $L_{v.source@d1}$=the optical distance between the source beam manipulator arrangement and a virtual source, image of a virtual source, common focus point and/or intermediate point of the beam;
- $L_{v.source@d2}$=the optical distance between the manipulator array arrangement and a virtual source, image of a virtual source, common focus point and/or intermediate point of the beam;
- $U_{beam.energy@d1}$=the beam energy at the source beam manipulator arrangement; and
- $U_{beam.energy@d2}$=the beam energy at the manipulator array arrangement.

Further clause 10: The apparatus according to any of further clauses 5 to 9, wherein for each source beam manipulator arrangement, the source beam manipulator arrangement and the manipulator array arrangement are configured so that overall aberrations are reduced by the combined effects of: the deflection angle applied to a beam path by the source beam manipulator arrangement; the deflection angle applied to the same beam path by the manipulator array arrangement; the optical distance between the source beam manipulator arrangement and a virtual source, image of a virtual source, common focus point and/or intermediate point of the beam; the optical distance between the manipulator array arrangement and a virtual source, image of a virtual source, common focus point and/or intermediate point of the beam; the beam energy at the source beam manipulator arrangement; and the beam energy at the manipulator array arrangement.

Further clause 11: The apparatus according to any of further clauses 5 to 10, wherein two or more of the dispersive components on at least one of the beam paths are arranged so that the dispersive effects of the two more dispersive components at least partially cancel each other out.

Further clause 12: The apparatus according to any of further clauses 5 to 11, wherein each source beam manipulator arrangement is configured to direct a beam path to cross the charged particle optical axis of the apparatus before the beam reaches the condenser lens arrangement.

Further clause 13: The apparatus according to any of further clauses 5 to 12, wherein each source beam manipulator arrangement is configured to direct a beam path so that the beam path first crosses the beam path of one or more other sources in the condenser lens arrangement.

Further clause 14: The apparatus according to any preceding further clause, wherein the path of the beam emitted from a source is substantially along, or substantially parallel to, the charged particle optical axis; and the condenser lens arrangement is configured to receive a beam from said source without the beam being manipulated by a source beam manipulator arrangement.

Further clause 15: The apparatus according to any of further clauses 1 to 13, wherein a source beam manipulator arrangement is provided between each source and the condenser lens arrangement.

Further clause 16: The apparatus according to further clause 15, wherein each source beam manipulator arrangement comprises a multi-beam generator configured to generate a plurality of sub-beams in dependence on a received source beam.

Further clause 17: The apparatus according to further clause 16, wherein each source beam manipulator arrangement comprises a micro-lens array configured to focus each sub-beam.

Further clause 18: The apparatus according to further clause 17, wherein each micro-lens array is configured to substantially focus sub-beams onto the condenser lens arrangement.

Further clause 19: The apparatus according to further clause 17, wherein each micro-lens array is configured to substantially focus sub-beams onto the manipulator array arrangement.

Further clause 20: The apparatus according to any of further clauses 15 to 19, wherein the source beam manipulator arrangements are all arranged in the same plane; and optionally, the source beam manipulator arrangements are arranged in a plane that is parallel to the plane of the condenser lens arrangement.

Further clause 21: The apparatus according to any of further clauses 15 to 20, wherein one or more source beam manipulator arrangements comprises a multi-beam generator, a micro-lens array and a deflector.

Further clause 22: The apparatus according to any of further clauses 15 to 21, wherein all of the sources are arranged in the same plane; and optionally, the sources are arranged in a plane that is parallel to the plane of the condenser lens arrangement.

Further clause 23: The apparatus according to any of further clauses 15 to 22, wherein all of the source beam manipulator arrangements are comprised by a multi-source beam manipulator arrangement.

Further clause 24: The apparatus according to any of further clauses 15 to 23, wherein, for each source, the beam path of the beam emitted from the source is orthogonal to the source beam manipulator arrangement configured to manipulate the beam.

Further clause 25: The apparatus according to any of further clauses 15 to 24, wherein one or more of the source beam manipulator arrangements comprises elliptical apertures.

Further clause 26: The apparatus according to any of further clauses 15 to 25, the apparatus further comprising, for each of one or more of the sources, a deflector set configured to apply deflections to the emitted beam from the source; wherein: each deflector set comprises a plurality of deflectors; and the deflector set comprises first and second deflectors configured to apply deflections with opposite signs.

Further clause 27: The apparatus according to further clause 26, wherein the first and second deflectors are arranged so that: the first and second deflectors are both up-beam of the source beam manipulator arrangement; the first and second deflectors are both down-beam of the source beam manipulator arrangement; the first deflector is up-beam of the source beam manipulator arrangement and the second deflector is down-beam of the source beam manipulator arrangement; the first deflector is comprised by the source beam manipulator arrangement and the second deflector is down-beam of the source beam manipulator arrangement; or the second deflector is comprised by the source beam manipulator arrangement and the first deflector is up-beam of the source beam manipulator arrangement.

Further clause 28: The apparatus according to any preceding further clause, wherein the condenser lens arrangement is moveable along at least one of the beam paths, along the charged particle optical axis, and/or proximately relative to the manipulator array arrangement.

Further clause 29: The apparatus according to any preceding further clause, wherein the condenser lens arrangement is configured so that the beam width of each beam output from the condenser lens arrangement is adjustable.

Further clause 30: The apparatus according to any preceding further clause, wherein the condenser lens arrangement comprises an electro-magnetic lens; and the excitation level of the lens is variable.

Further clause 31: The apparatus according to further clause 27 or 28, wherein the condenser lens arrangement comprises a plurality of condenser lenses each configured to have a variable parameter so that the condenser lens arrangement properties are adjustable.

Further clause 32: The apparatus of further clause 31, wherein the variable parameter is a displacement between the plurality of condenser lenses, so that they are moveable relative to each other.

Further clause 33: The apparatus according to any preceding further clause, further comprising one or more width apertures, wherein each width aperture is configured to adjust width of the beam from a source.

Further clause 34: The apparatus according to further clause 33, wherein each width aperture is configured to be operable by movement along the beam path so as to adjust the width of the beam.

Further clause 35: The apparatus according to further clause 33 or 34, wherein each width aperture is configured to be operable by having an adjustable aperture dimension, preferably the diameter of the aperture, in order to adjust the width of the beam.

Further clause 36: The apparatus according to according to any preceding further clause, wherein the manipulator array arrangement comprises: a first aperture array for generating a plurality of sub-beams in a single column; and a second aperture array with substantially the same arrangement of apertures as the first aperture array; wherein the second aperture array is located down-beam of the first aperture array and arranged so that, in use, each aperture of the second aperture array receives a sub-beam from a corresponding aperture of the first aperture array.

The invention claimed is:

1. A multi-source illumination apparatus for illuminating a sample with charged particles, the apparatus comprising:
   a condenser lens arranged to receive beams from a plurality of sources, each source arranged to emit a beam of charged particles; and
   a manipulator array arrangement configured to receive beams that have passed through the condenser lens,
   wherein:
   the beams are arranged such that, at a plane of the condenser lens, a beam from at least one source intersects with at least part of one other beam from a different one of the plurality of sources;
   the condenser lens is configured to separately substantially collimate the received beams from each source; and
   the manipulator array arrangement is configured to manipulate the beams that have been substantially collimated by the condenser lens to generate one or more beams, in a single column, that comprise charged particles from the plurality of sources, the manipulator array arrangement comprising a multi-beam generator configured to:
   receive the plurality of substantially collimated beams; and
   generate a multi-beam of sub-beams in dependence on each of the received plurality of substantially collimated beams.

2. The apparatus according to claim 1, wherein the manipulator array arrangement is configured to manipulate at least one of the sub-beams, the manipulator array arrangement being configured to manipulate the at least one sub-beam by applying, to the at least sub-beam, one or more selected from: a focus, deflection, change of cross-sectional shape and/or blanking.

3. The apparatus according to claim 2, wherein the multi-beam is a rectangular, square, rhombic or hexagonal array of sub-beams.

4. The apparatus according to claim 1, further comprising a coulomb aperture array, wherein:
   the coulomb aperture array is arranged in paths of the beams between the plurality of sources and the condenser lens; and
   the coulomb aperture array is arranged to receive a single beam from one or more of the sources and, for each received single beam, to output a multi-beam in dependence on the received single beam, with each output multi-beam by the coulomb aperture array comprising a plurality of sub-beams of charged particles, such that the condenser lens receives and substantially collimates one or more multi-beams and the manipulator array arrangement manipulates one or more multi-beams.

5. The apparatus of claim 1, wherein the manipulator array arrangement comprises a deflector array arranged to deflect the beams that have been substantially collimated by the condenser lens to generate a plurality of substantially parallel substantially collimated beams, for receipt by the multi-beam generator, that comprise charged particles from the plurality of sources, wherein the multi-beam of sub-beams comprises a plurality of substantially collimated sub-beams.

6. The apparatus according to claim 1, wherein a beam from each source intersects in the plane of the condenser lens with a beam from each of the other sources.

7. The apparatus according to claim 1, wherein beams from a plurality of sources intersect at a mid-point in the plane of the condenser lens.

8. The apparatus according to claim 1, further comprising a controller configured to control an emission current of emitted beam of charged particles by the respective source.

9. The apparatus according to claim 1, further comprising a controller configured to control an emission opening angle of the respective source.

10. The apparatus according to claim 1, configured such that two or more of the sources are arranged symmetrically about a charged particle optical axis of the apparatus.

11. The apparatus according to claim 1, further comprising the sources and wherein all of the sources are arranged in a plane that is substantially orthogonal to a charged particle optical axis of the apparatus.

12. The apparatus according to claim 1, wherein the manipulator array arrangement has a beam input and the beam from each source is arranged such that, at the beam input and in a plane that is substantially orthogonal to a charged particle optical axis, an illumination area of a beam from a source substantially abuts one or more other illumination areas of one or more beams from one or more other sources.

13. A multi-beam inspection and/or metrology tool comprising:
the multi-source illumination apparatus according to claim 1, wherein the multi-source illumination apparatus is arranged to illuminate a sample; and
a detector arranged to detect charged particles received from the illuminated sample.

14. A multi-beam lithography tool comprising the multi-source illumination apparatus according to claim 1, wherein the multi-source illumination apparatus is arranged to illuminate a resist on a substrate.

15. A method of generating one or more beams of charged particles for illuminating a sample, the method comprising:
emitting, by each source of a plurality of sources, a beam of charged particles such that the beams at least partially intersect;
substantially collimating the beams from each source at position along a charged particle optical axis where the beams at least partially intersect; and
manipulating the substantially collimated beams to generate one or more beams, in a single column, that comprise charged particles from the plurality of sources, the manipulating comprising:
receiving the plurality of substantially collimated beams, and then
generating a multi-beam of sub-beams in dependence on each of the received plurality of substantially collimated beams.

16. The method of claim 15, further comprising deflecting the substantially collimated beams to generate a plurality of substantially parallel substantially collimated beams that comprise charged particles from the plurality of sources, wherein the multi-beam comprises a plurality of substantially collimated sub-beams.

17. A multi-source illumination apparatus for generating a multi-beam of charged particles, the apparatus comprising:
a manipulator array arrangement that comprises a beam input and a beam output, wherein:
the beam input is configured to receive beams from a plurality of sources, each source arranged to emit a beam of charged particles;
the beams are arranged such that, at the beam input and in a plane that is substantially orthogonal to a charged particle optical axis, an illumination area of each beam substantially abuts an illumination area one or more other beams; and
the manipulator array arrangement is configured so that a multi-beam of sub-beams of charged particles is output from the beam output in a single column.

18. The apparatus of claim 17, wherein the beams are arranged so that the beams from all of the sources cross-over each other at one or more positions along the charged particle optical axis before the beams reach the beam input.

19. The apparatus of claim 18, further comprising a condenser lens, wherein the beams from all of the sources cross-over each other in substantially a same region in a plane that is orthogonal to the charged particle optical axis, the condenser lens arranged to be in the region in the plane where the beams cross-over each other.

20. The apparatus according to claim 5, wherein the plurality of substantially parallel collimated beams output from the deflector array are substantially parallel with a charged particle optical axis of the apparatus.

* * * * *